(12) United States Patent
Fujimoto et al.

(10) Patent No.: US 6,621,753 B2
(45) Date of Patent: *Sep. 16, 2003

(54) SEMICONDUCTOR DEVICE

(75) Inventors: Tomonori Fujimoto, Osaka (JP);
Kiyoto Ohta, Osaka (JP); Yuji Yamasaki, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/323,746

(22) Filed: Dec. 20, 2002

(65) Prior Publication Data

US 2003/0086319 A1 May 8, 2003

Related U.S. Application Data

(63) Continuation of application No. 10/003,430, filed on Dec. 6, 2001, now Pat. No. 6,507,529.

(30) Foreign Application Priority Data

Dec. 7, 2000 (JP) .................................... 2000-372464

(51) Int. Cl.[7] ................................................ G11C 7/00
(52) U.S. Cl. .............. 365/222; 365/189.01; 365/189.05
(58) Field of Search ..................... 365/222, 189.01, 365/189.05, 225.7, 230.06, 230.08, 189.09; 711/106

(56) References Cited

U.S. PATENT DOCUMENTS

| | | | |
|---|---|---|---|
| 5,644,544 A | * | 7/1997 | Mizukami ................... 365/222 |
| 5,822,265 A | | 10/1998 | Zdenek |
| 5,959,925 A | | 9/1999 | Tatsumi |
| 6,005,818 A | | 12/1999 | Ferrant |
| 6,094,705 A | | 7/2000 | Song |
| 6,118,719 A | | 9/2000 | Dell et al. |
| 6,282,606 B1 | | 8/2001 | Holland |
| 6,507,529 B2 | * | 1/2003 | Fujimoto et al. ........... 365/222 |

* cited by examiner

Primary Examiner—David Lam
(74) Attorney, Agent, or Firm—McDermott, Will & Emery

(57) ABSTRACT

A semiconductor device capable of refreshing a plurality of memory cells. In operation, when requesting a data read operation a /row selection control signal is input to a set/reset circuit of a row selection control circuit, whereby an H-level hidden refresh control signal is output and an internal row selection control signal transitions to the H level. As a result, an intended word line is selected, and a refresh operation is initiated. Then, a sense amplifier activation completion signal SEND is input via a delay circuit to the set/reset circuit after completion of a sense operation, and the internal row selection control signal transitions to the L level. The sense amplifier activation completion signal SEND is input to another set/reset circuit after passing through three delay circuits, and an RW row selection control signal transitions to the H level, thereby performing a data read operation.

10 Claims, 19 Drawing Sheets

SEMICONDUCTOR DEVICE

This application is a continuation of application Ser. No. 10/003,430 filed Dec. 6, 2001 now U.S. Pat. No. 6,507,529.

BACKGROUND OF THE INVENTION

The present invention relates to a semiconductor device including a memory cell that needs to be refreshed for storing data therein.

Typically, a DRAM requires a refresh operation. There is a refresh control method for a DRAM in which a control signal is provided externally, whereby a refresh address is generated by an internal counter, or the like. A refresh control method of this type is called "auto refresh". While an auto refresh operation is being performed, a normal read or write operation cannot be performed.

A DRAM that operates in synchronism with a clock is described in, for example, Japanese Laid-Open Patent Publication No. 2000-163966. In such a DRAM, circuits of the row system operate based on a first edge of a clock, and circuits of the column system operate based on a second edge of the clock.

FIG. 14 illustrates an example of a DRAM that has an auto refresh function and operates in synchronism with a clock. In the figure, CLK denotes a clock, NRAUT denotes an auto refresh control signal, NRAS denotes a row control signal, and NCAS denotes a column control signal. The general operation of the DRAM will now be described with reference to a timing diagram of FIG. 15. Upon activation (transition to an L level) of the auto refresh control signal NRAUT in synchronism with the second leading edge of the clock from the left side, an auto refresh operation is performed. It is assumed in this example that an auto refresh operation requires two clocks. The auto refresh operation finishes at the fourth leading edge of the clock from the left side, after which a read operation, for example, can be performed. In this example, a read operation is completed in two clocks by activating (bringing to the L level) the control signal NRAS at the fourth leading edge of the clock from the left side, and activating (bringing to the L level) the control signal NCAS at the fifth leading edge of the clock from the left side. In the illustrated example, the next auto refresh operation can be performed from the sixth leading edge of the clock.

As described above, in a conventional DRAM, a refresh operation and a normal read/write operation are performed as separate operation cycles, whereby it is necessary to insert a cycle for a refresh operation while holding a read/write operation for every predetermined refresh period, thereby lowering the data transfer rate of the DRAM. Particularly, when the predetermined refresh period is short, it is necessary to insert a refresh operation cycle frequently, thereby significantly lowering the data transfer rate.

SUMMARY OF THE INVENTION

An object of the present invention is to provide a semiconductor device such as a DRAM that requires a refresh operation in which the reduction in data transfer rate due to the refresh operation is suppressed or prevented so as to achieve a higher data transfer rate than in the prior art.

In order to achieve the object, the present invention employs a configuration such that when a data read or write operation is requested, a single refresh operation can be automatically performed within the data read or write cycle, and when a data read or write operation is not requested, each auto refresh operation can be completed within a single clock.

Specifically, a semiconductor device of the present invention includes: a plurality of memory cells that need to be refreshed for storing data therein; a plurality of sense amplifiers for amplifying data read out from the memory cells; and a refresh control signal generation circuit for, when a data read or write operation is requested, generating a refresh control signal upon receiving a data read or write control signal, wherein each refresh operation is performed within a single read or write operation cycle.

In one embodiment of the present invention, the refresh control signal generation circuit instructs the sense amplifiers to start operating and perform a refresh operation before the data read or write operation based on the refresh control signal.

In one embodiment of the present invention, the refresh control signal generation circuit activates a row selection control signal for a refresh operation as the refresh control signal upon receiving a row selection control signal as the data read or write control signal.

In one embodiment of the present invention, the semiconductor device further includes: a sense state signal generation circuit for generating a sense state signal according to a data amplification operation by the sense amplifiers; and a row selection control circuit for inactivating the refresh control signal of the refresh control signal generation circuit based on the sense state signal of the sense state signal generation circuit after initiation of a refresh operation by the refresh control signal generation circuit,-and for re-initiating an operation of the sense amplifiers by generating a row selection control signal for a normal operation as the data read or write control signal after completion of an operation of the sense amplifiers.

In one embodiment of the present invention, the sense state signal generation circuit generates, as the sense state signal, a sense activation completion signal that indicates completion of activation of the sense amplifiers.

In one embodiment of the present invention, the row selection control circuit generates an amplification completion signal obtained by delaying the sense activation completion signal of the sense state signal generation circuit by an amount of time equal to or greater than an amount of time that is required from activation of the sense amplifiers until data on a bit line is sufficiently amplified, and inactivates the refresh control signal and activates the row selection control signal for a normal operation based on the amplification completion signal.

In one embodiment of the present invention, the row selection control circuit includes: a refresh counter; an address latch for latching a row address of data to be read or written; an address selection circuit; and a selection control circuit for instructing the address selection circuit to select a row address latch side after completion of an operation of the sense amplifiers based on a sense activation completion signal of the sense state signal generation circuit.

In one embodiment of the present invention, the semiconductor device further includes a refresh address updater for updating the refresh counter by generating a refresh count signal immediately after the address selection circuit selects the row address latch side according to the instruction from the selection control circuit.

In one embodiment of the present invention, the semiconductor device further includes: a column selection control circuit for outputting a column selection control signal and reading or writing data that has been amplified by the sense amplifiers based on the row selection control circuit; and a reset circuit for terminating an operation of the sense amplifiers by inactivating the row selection control signal for a normal operation of the row selection control circuit after completion of the data read or write operation by the column selection control circuit.

In one embodiment of the present invention, the semiconductor device further includes an internal auto refresh control signal generation circuit for generating an internal auto refresh control signal upon receiving an auto refresh control signal when a data read or write operation is not requested, wherein the refresh operation is performed through a single refresh operation that is performed within a single read or write operation cycle and an auto refresh operation that is performed when there is no read or write operation to be performed.

In one embodiment of the present invention, the auto refresh control signal is input to the refresh control signal generation circuit, and the internal auto refresh control signal is generated by the refresh control signal generation circuit, which functions also as the internal auto refresh control signal generation circuit.

In one embodiment of the present invention, the semiconductor device further includes a reset circuit for, when the internal auto refresh control signal is generated, stopping the generation of the row selection control signal for a normal operation by the row selection control circuit.

In one embodiment of the present invention, the semiconductor device further includes: a refresh counter; an address latch for latching a row address of data to be read or written; an address selection circuit; a selection control circuit for instructing the address selection circuit to select a row address latch side after completion of an operation of the sense amplifiers based on a sense activation completion signal of the sense state signal generation circuit; and a refresh address updater for updating the refresh counter by generating a refresh count signal immediately after the address selection circuit selects the row address latch side according to the instruction from the selection control circuit, wherein the refresh counter, the address latch, the address selection circuit, the selection control circuit and the refresh address updater are shared by a refresh operation that is performed within a single read or write operation cycle and an auto refresh operation that is performed when the read or write operation is not being performed.

In one embodiment of the present invention, the semiconductor device further includes: a fuse circuit for replacing a word line having a defective memory cell connected thereto by a spare word line and for storing an inoperable row address; and a fuse reset circuit for resetting the inoperable row address of the fuse circuit each time a data read or write operation based on the column selection control circuit is completed.

In one embodiment of the present invention, the semiconductor device further includes a reset circuit for, when the column selection control signal from the column selection control circuit is not activated at a predetermined clock edge, resetting the row selection control signal for a normal operation from the row selection control circuit after passage of a predetermined amount of time from the predetermined clock edge.

In one embodiment of the present invention, the refresh control signal generation circuit dose not activate the row selection control signal for a refresh operation as the refresh control signal when the row selection control signal as the data read or write control signal is received consecutively at leading or trailing edges of a clock.

Another semiconductor device of the present invention includes: a plurality of memory cells that need to be refreshed for storing data therein; a plurality of sense amplifiers for amplifying data read out from the memory cells; an internal auto refresh control signal generation circuit for, when a data read or write operation is not requested, generating an internal auto refresh control signal upon receiving an auto refresh control signal; a sense state signal generation circuit for generating a sense state signal according to a data amplification operation by the sense amplifiers; and a row selection control circuit for inactivating the refresh control signal of the internal auto refresh control signal generation circuit based on the sense state signal of the sense state signal generation circuit after initiation of an auto refresh operation by the internal auto refresh control signal generation circuit, wherein each auto refresh operation is performed within a single clock.

Thus, according to the present invention, when a data read or write operation is requested, the refresh control signal generation circuit generates a refresh control signal. Therefore, for every data read or write operation cycle, a refresh operation based on the refresh control signal is performed within the operation cycle. As a result, it is no longer necessary to perform an auto refresh operation for every refresh period, thereby increasing the data transfer rate of the semiconductor device.

According to the present invention, when a data read or write operation is requested, a refresh operation is performed first, and the data read or write operation is performed following the completion of the refresh operation. Particularly, the row address (external row address) of data to be read or written that has been latched by the row address latch is selected by the address selection circuit based on the sense activation completion signal generated in the refresh operation, which is performed first. Therefore, when initiating the data read or write operation, which is to be performed later, decoding of the external row address is already completed, thereby reducing the read or write cycle by the amount of time saved.

Moreover, according to the present invention, the refresh counter is selected immediately after the address selection circuit selects the row address latch. Therefore, when the next data read or write operation is requested, decoding of the refresh address in the refresh operation, which is performed first, is completed, thereby further reducing the data read or write cycle by the amount of time saved.

Furthermore, according to the present invention, after the column selection operation in the read or write operation is completed, the data read or write control signal is inactivated with the operation of the sense amplifiers being terminated, and the bit line through which data from memory cells is to be read out is precharged. Thus, it is possible to perform a column control, stop the operation of sense amplifiers and to precharge a bit line within a single clock, thereby reducing the number of clock cycles for a data read or write operation.

Furthermore, according to the present invention, an auto refresh operation is performed based on the auto refresh control signal when a data read or write operation is not requested. Particularly, the auto refresh control signal generation circuit, the refresh counter, etc., are shared, whereby it is possible to reduce the number of circuits and the actual evaluation of these circuits is simplified.

In addition, according to the present invention, even if the programmed value (inoperable address) stored in the fuse circuit changes due to an influence of noise, or the like, the programmed value is reset for every read or write cycle, thereby preventing erroneous replace.

Moreover, according to the present invention, even in a dummy cycle or in a case where the column selection control signal is erroneously in an inactive state at a predetermined clock edge, the active state of the data read or write control signal of the row selection control circuit can be maintained for a relatively long period of time, and the sense amplifier operation can be maintained for an accordingly extended period of time, thereby preventing malfunction of the semiconductor device.

Furthermore, according to the present invention, in a page operation mode in which the row selection control signal is consecutively received over more than one clock cycles, the row selection control signal for a refresh operation is not activated for the second and subsequent clock cycles, whereby data can be immediately read or written without performing the refresh operation.

In addition, according to the present invention, the sense state signal generation circuit generates the sense state signal according to the data amplification operation by the sense amplifiers. Therefore, after the internal auto refresh control signal generation circuit generates the internal auto refresh control signal based on a leading edge of the clock, thereby initiating the internal auto refresh operation, the generation of the internal auto refresh control signal is stopped upon completion of the data amplification operation, which is determined based on the sense state signal. Therefore, it is possible to complete the auto refresh operation within a single clock.

DETAILED DESCRIPTION OF THE INVENTION

Preferred embodiments of the present invention will now be described with reference to the accompanying drawings.

Figure 1:
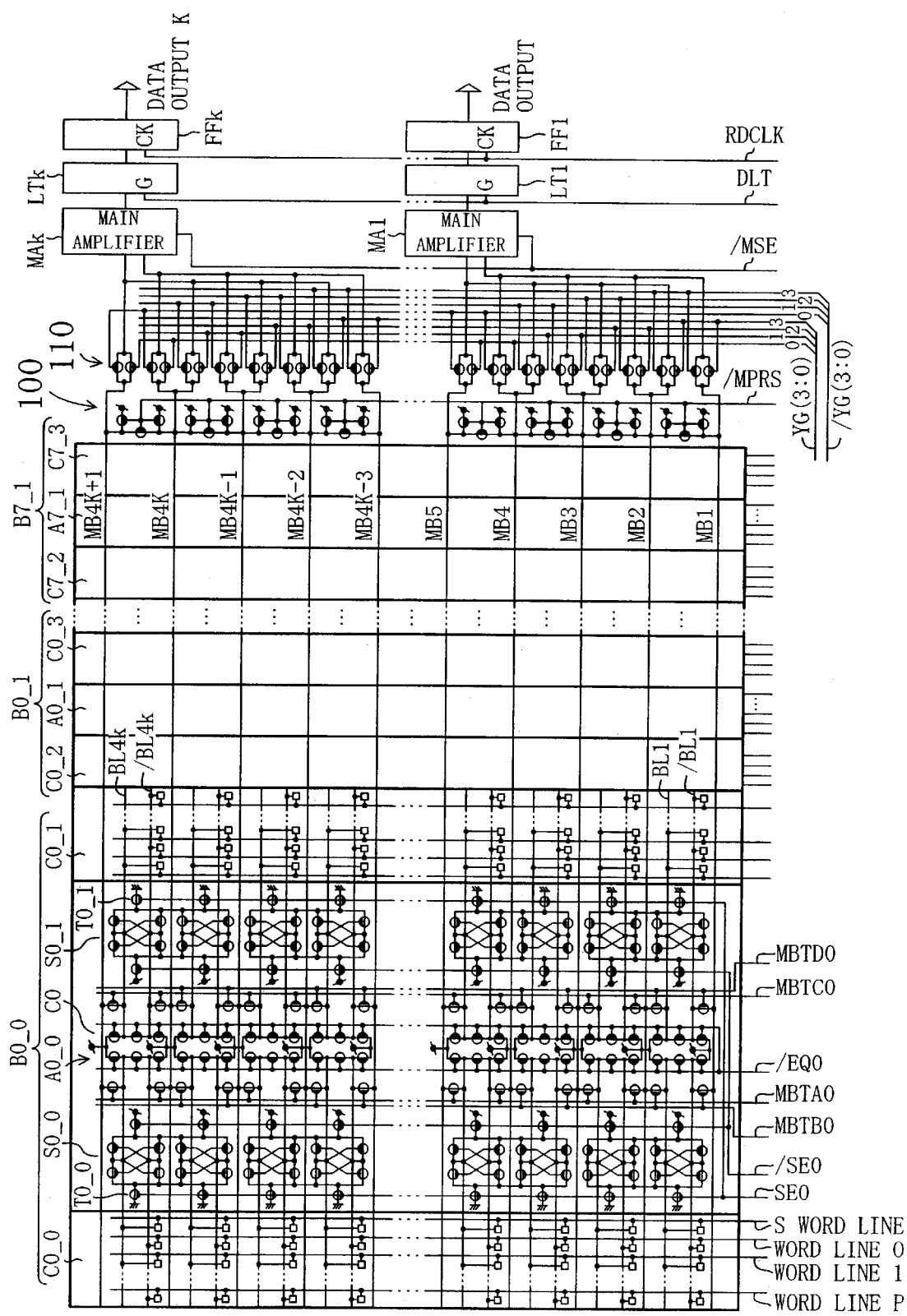
FIG. 1 is a diagram illustrating memory blocks and other components therearound of a semiconductor device according to an embodiment of the present invention.
Figure 2:
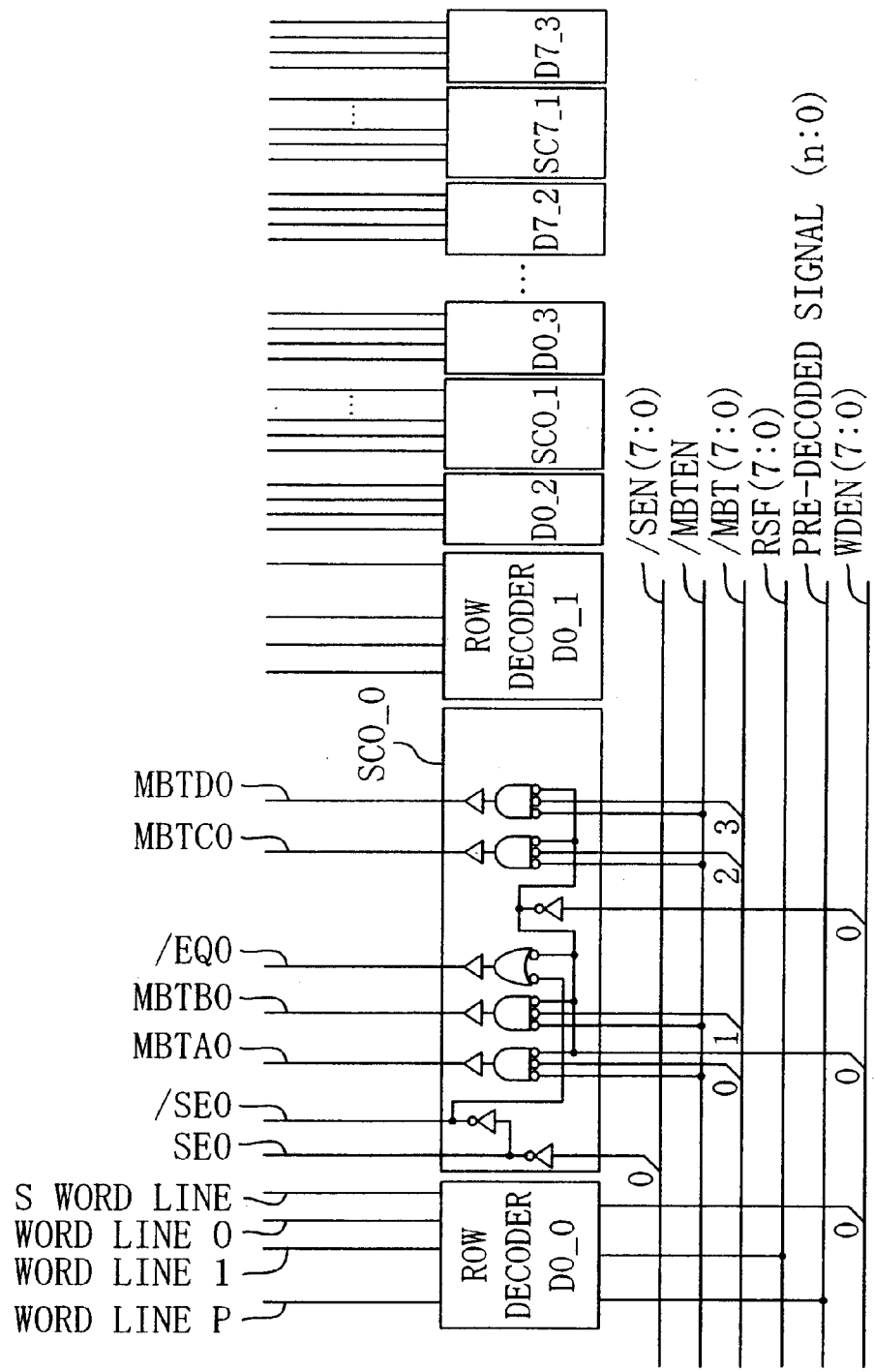
FIG. 2 is a block diagram illustrating a row decoder and other components therearound of the semiconductor device.
Figure 3:
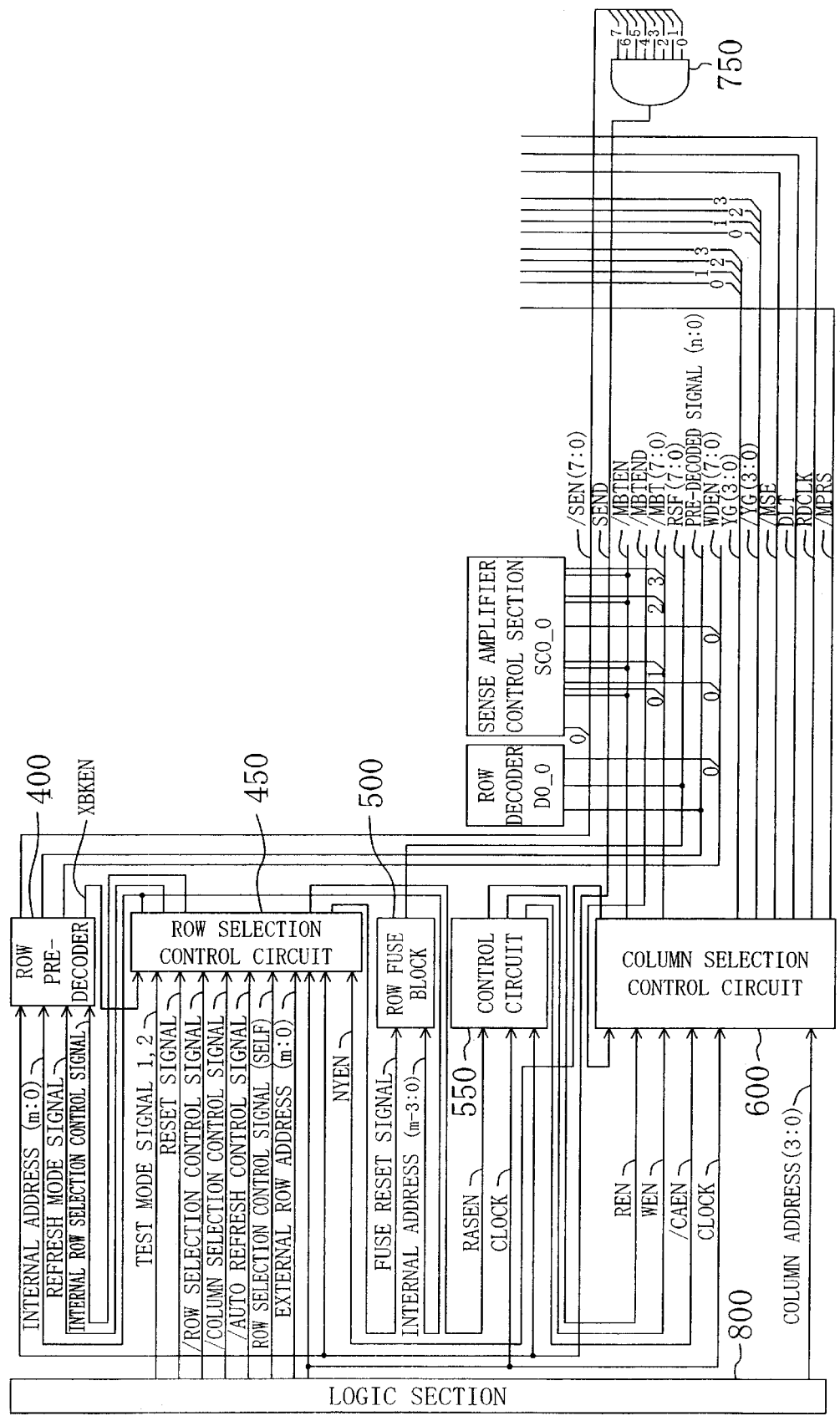
FIG. 3 is a block diagram illustrating a circuit section including a row selection control circuit provided in the semiconductor device.

FIG. 1, FIG. 2 and FIG. 3 illustrate a DRAM, which is a semiconductor device according to an embodiment of the present invention. FIG. 1 illustrates a configuration of a memory cell block section, where B0_0 and B0_1 denote a pair of memory blocks, and the memory cell block section includes a total of eight memory block pairs. In the figure, the second to eighth memory blocks B1_0 to B7_0 are omitted, and the eighth memory block B7_1 is shown. The memory blocks B0_0 to B7_1 have the same configuration. The memory block B0_0 includes two memory cell arrays C0_0 and C0_1, with a sense amplifier block A0_0 sandwiched therebetween. The memory block B0_1 also includes a memory cell array C0_2 on the left side, a sense amplifier block A0_1 in the center, and a memory cell array C0_3 on the right side. Similarly, the memory block B7_1 includes two memory cell arrays C7_2 and C7_3 and a sense amplifier block A7_1.

The internal configuration of the memory block B0_0 of FIG. 1 is, for example, as follows. Each of the memory cell arrays C0_0 and C0_1 includes a plurality of memory cells MC. Each column of cells MC are connected together by a pair of bit lines BL and /BL, and are selected by a plurality of word lines and one spare word line (S word line) for redundancy replacement that are extending in the row direction. Moreover, the sense amplifier block A0_0 includes a pair of sense amplifier groups S0_0 and S0_1 for performing a differential amplification operation on data stored in the memory cells MC of the left and right memory cell arrays C0_0 and C0_1, and a precharge circuit group CO for precharging each pair of bit lines BL and /BL to a ½ value of the power supply voltage.

Moreover, in FIG. 1, MB1 to MB4$k$+1 denote main bit lines extending across the memory blocks B0_0 to B7_1. Five main bit lines are provided for every four columns of memory cells MC. Switch circuit groups T0_0 and T0_1 are provided in the sense amplifier blocks A0_0 to A7_1 of the memory blocks B0_0 to B7_1 so that the main bit lines MB1 to MB4$k$+1 are connected to the bit lines (BL1, /BL1) to (BL4$k$, /BL4$k$) of the memory blocks B0_0 to B7_1. Provided at one end of the main bit lines MB1 to MB4$k$+1 (on right side of the memory block B7_1 in the figure) are a main precharge circuit 100 for precharging the main bit lines, and a switch circuit 110 including parallel circuits each having a p-channel transistor and an n-channel transistor connected in parallel to each other for selectively passing the data of the main bit lines MB1 to MB4$k$+1 to main amplifiers MA1 to MA4$k$. Provided on the right side of the main amplifiers MA1 to MA4$k$ are latch circuits LA1 to LA$k$ for holding data that has been amplified by the main amplifiers MA1 to MAk, and D flip flop circuits FF1 to FFk for receiving and latching data that has been latched by the latch circuits LA1 to LAk.

FIG. 2 illustrates row decoders D0_0 to D7_3 for selecting word lines of the memory cell block section illustrated in FIG. 1, and sense amplifier control sections SC0_0 to SC7_1 for controlling the sense amplifier groups and the precharge circuit groups. The sense amplifier control sections SC0_0 to SC7_1 have the same configuration, and the internal configuration of only the memory block B0_0 is shown in the figure. Basically, the sense amplifier control section SC0_0 connects and disconnects the precharge circuit group C0 to and from the bit line pairs BL and /BL, amplifies data output onto the bit line pairs by the operation of the sense amplifier groups S0_0 and S0_1, and during a data write/read operation, connects a plurality of bit lines BL and /BL to the main bit lines MB1 to MB4k by using the switch circuits T0_0 and T0_1.

FIG. 3 illustrates a group of circuits to be provided in the semiconductor device. In the figure, reference numeral 800 denotes a logic section, 400 denotes a row pre-decoder, 450 denotes a row selection control circuit, and 500 denotes a row fuse block for replacing a row address. The row fuse block 500 replaces a word line connected to a memory cell that has become inoperable due to a defect with a spare word line. Reference numeral 550 denotes a control circuit, and 600 denotes a column selection control circuit. The logic section 800 outputs a /row selection control signal, a /column selection control signal, an /auto refresh control signal, and an external address (m:0) to the row selection control circuit 450, a column address (3:0) to the column selection control circuit 600, and a clock to the row selection control circuit 450, the control circuit 550 and the column selection control circuit 600. When driving a sense amplifier, the row pre-decoder 400 outputs an L-level sense amplifier activation signal /SEN (7:0). The sense amplifier control sections SC0_0 to SC7_1 of FIG. 2 receive the sense amplifier activation signal /SEN to activate the sense amplifier groups S0_0, S0_1, . . . .

The sense amplifier activation signal /SEN (7:0) is input to an AND circuit 750 as illustrated in FIG. 3. The AND circuit (sense state signal generation circuit) 750 is provided further to the right of the memory block B7_1, which is located on the right end of FIG. 1, and outputs an L-level sense amplifier activation completion signal (sense activation completion signal) SEND upon activation of a sense amplifier. The activation completion signal SEND is input to the row selection control circuit 450 and the row pre-decoder 400 located to the left of the memory block B0_0, which is located on the left end of FIG. 1. The sense amplifier activation completion signal SEND is important to the following description of the present invention.

Figure 4:
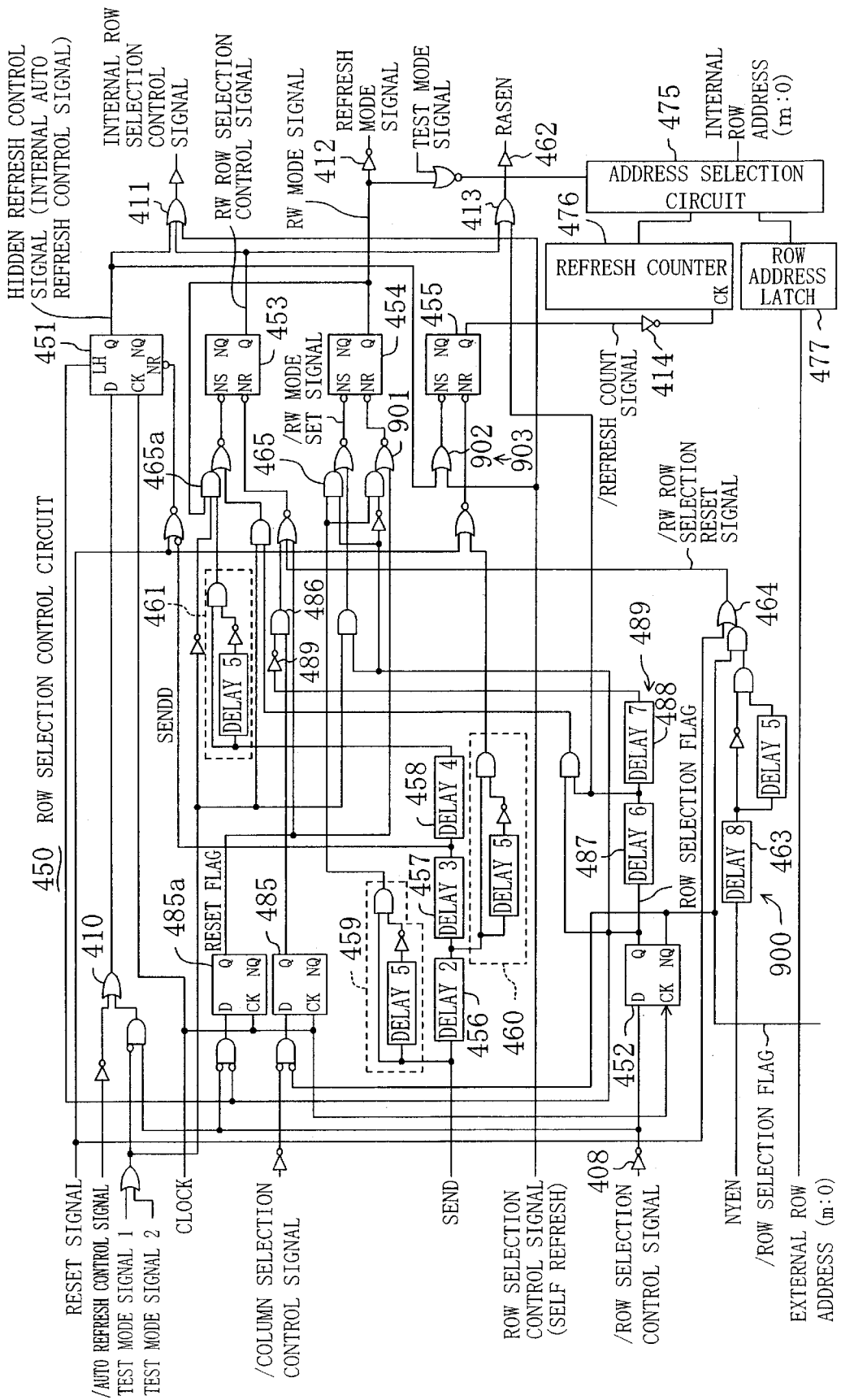
FIG. 4 is a diagram illustrating an internal configuration of a fuse reset signal generation circuit provided in the semiconductor device.

Next, FIG. 4 illustrates the internal configuration of the row selection control circuit 450. The row selection control circuit 450 includes five set/reset circuits 451, 452, 453, 454 and 455, an address selection circuit 475, a refresh counter 476, and a row address latch 477. The row selection control circuit 450 receives a /row selection control signal (being active at the L level) (a control signal for a data read or write operation) that is output from the logic section 800 upon receipt of a data read or write request, and also receives the sense amplifier activation completion signal SEND.

The set/reset circuit (refresh control signal generation circuit) 451 receives, in a data read or write operation, a /row selection control signal from the logic section 800 via an inverter 408 and an OR circuit 410, and outputs an H-level hidden refresh control signal in synchronism with a leading edge of the clock so as to perform a refresh operation before a data read/write operation. The refresh control signal is turned, via an OR circuit 411, into an internal row selection control signal (refresh control signal) to be used in a refresh operation, and the internal row selection control signal is output to the row pre-decoder 400. Moreover, the set/reset circuit 451 is reset upon receiving, via a delay circuit 2-456 and a delay circuit 3-457, the L-level sense amplifier activation completion signal SEND from the AND circuit 750. The total delay time of the two delay circuits is set to be an amount of time that is required from when the activation of the sense amplifier group is completed to when data of a bit line is sufficiently amplified. Therefore, an output signal SENDD of the delay circuit 3-457 in the latter stage serves as an amplification completion signal to reset the set/reset circuit 451, and the hidden refresh control signal transitions to the L level upon completion of the amplification of the data of the bit line.

Moreover, the set/reset circuit 454 of FIG. 4 is set to output an H-level RW mode signal (a read/write mode signal) when receiving, via an AND circuit 465, a pulse from a pulse generator 459 that generates a short pulse based on the activation completion signal SEND when the sense amplifier activation completion signal SEND is controlled to be at the H level (i.e., after completion of a refresh operation). The RW mode signal is inverted by an inverter 412 to be a refresh mode signal. The refresh mode signal is output to the row pre-decoder 400. Furthermore, the RW mode signal is input to the address selection circuit 475. The address selection circuit 475 selects the row address latch 477 when it receives the RW mode signal from the set/reset circuit (selection control circuit) 454, and selects the refresh counter 476 when it does not receive the RW mode signal. The row address latch 477 latches an external row address (m:0) as the row address of the data to be read or written. Therefore, the refresh counter 476 is selected when performing a refresh operation, while the row address latch 477 is selected when performing a read/write operation, and the selected address is output to the row pre-decoder 400 as an internal row address (m:0).

Moreover, when the sense amplifier activation completion signal SEND is controlled to the H level (i.e., after completion of a data amplification operation by a sense amplifier), the set/reset circuit 453 of FIG. 4 activates (to the H level) and outputs an RW row selection control signal (a row selection instruction signal for a read/write operation (normal operation) following a refresh operation) upon receiving, via an AND circuit 465a, a pulse from a pulse generator 461 that generates a short pulse based on the outputs of the delay circuit 2-456, the delay circuit 3-457 and a delay circuit 4-458 in the last stage, which delay the sense amplifier activation completion signal SEND. The total delay time of the three delay circuits is set to be the amount of time from the start to the end of a bit line precharge operation. The RW row selection control signal is output to the row pre-decoder 400 as an internal row selection signal through the OR circuit 411, and is also output to the control circuit 550 as a RAS enable signal RASEN via an OR circuit 413 and a buffer 462.

Then, upon receiving the hidden refresh control signal from the set/reset circuit 451, the set/reset circuit (refresh address updater) 455 of FIG. 4 is set and outputs an H-level /refresh count signal, thereby setting, to the L level, the refresh count signal (the clock signal of the refresh counter 476) that has gone through an inverter 414. When the sense amplifier activation completion signal SEND is controlled to the H level (i.e., after completion of a refresh operation), the set/reset circuit 455 is reset upon receiving an output pulse via the delay circuit 2-456, which delays the activation completion signal SEND by a predetermined time, and via a pulse generator 460 that generates a pulse based on the output of the delay circuit, thereby outputting an L-level /refresh count signal. Therefore, after completion of a refresh operation, the refresh count signal transitions to the H level, and the address of the refresh counter 476 is immediately updated by "1".

The operation of resetting the set/reset circuit 453, i.e., the operation of resetting the RW row selection control signal (row selection control signal for normal operation) to the L level, is performed as follows. A signal NYEN, which falls when the switch circuits T0_0 to T7_1 are turned OFF, is processed by a reset circuit 900 including a delay circuit 8-463 and an OR circuit 464, and then the RW row selection control signal is reset by using the output of the OR circuit 464 as an /RW row selection reset signal. Moreover, the operation of resetting the set/reset circuit 454, i.e., the operation of resetting the RW mode signal to the L level, is performed as follows. When the sense amplifier activation completion signal SEND returns to the H level (when the operation of a sense amplifier is terminated; in other words, when a bit line precharge operation is initiated) after resetting the RW row selection control signal (after a data read operation), the resetting operation is performed by turning an output pulse of the pulse generator 459, which receives the sense amplifier activation completion signal SEND, into an /RW mode reset signal via an AND circuit 466.

Figure 10A:
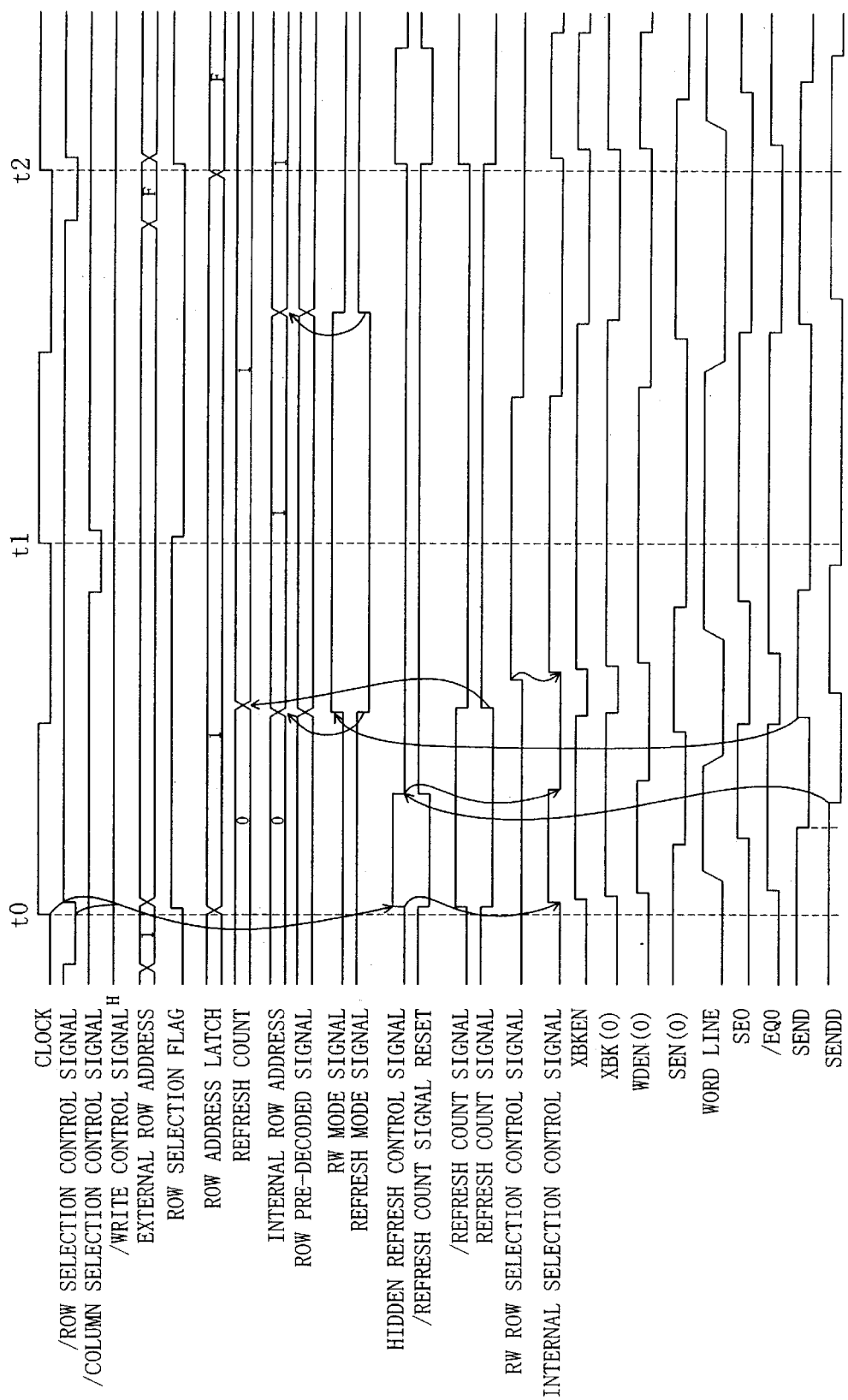
FIG. 10A shows the upper half of a timing chart for a read operation of the semiconductor device of the present embodiment.

Moreover, the set/reset circuit 452 of FIG. 4 outputs an H-level row selection flag for one clock from time t0 as illustrated in FIG. 10A upon receiving the L-level /row selection control signal. The row selection flag from the set/reset circuit 452 is input to an LH terminal of the set/reset circuit 451. When the set/reset circuit 451 receives, at the LH terminal, the H-level row selection flag at a leading edge of the clock, the level of the hidden refresh control signal does not change.

Figure 11A:
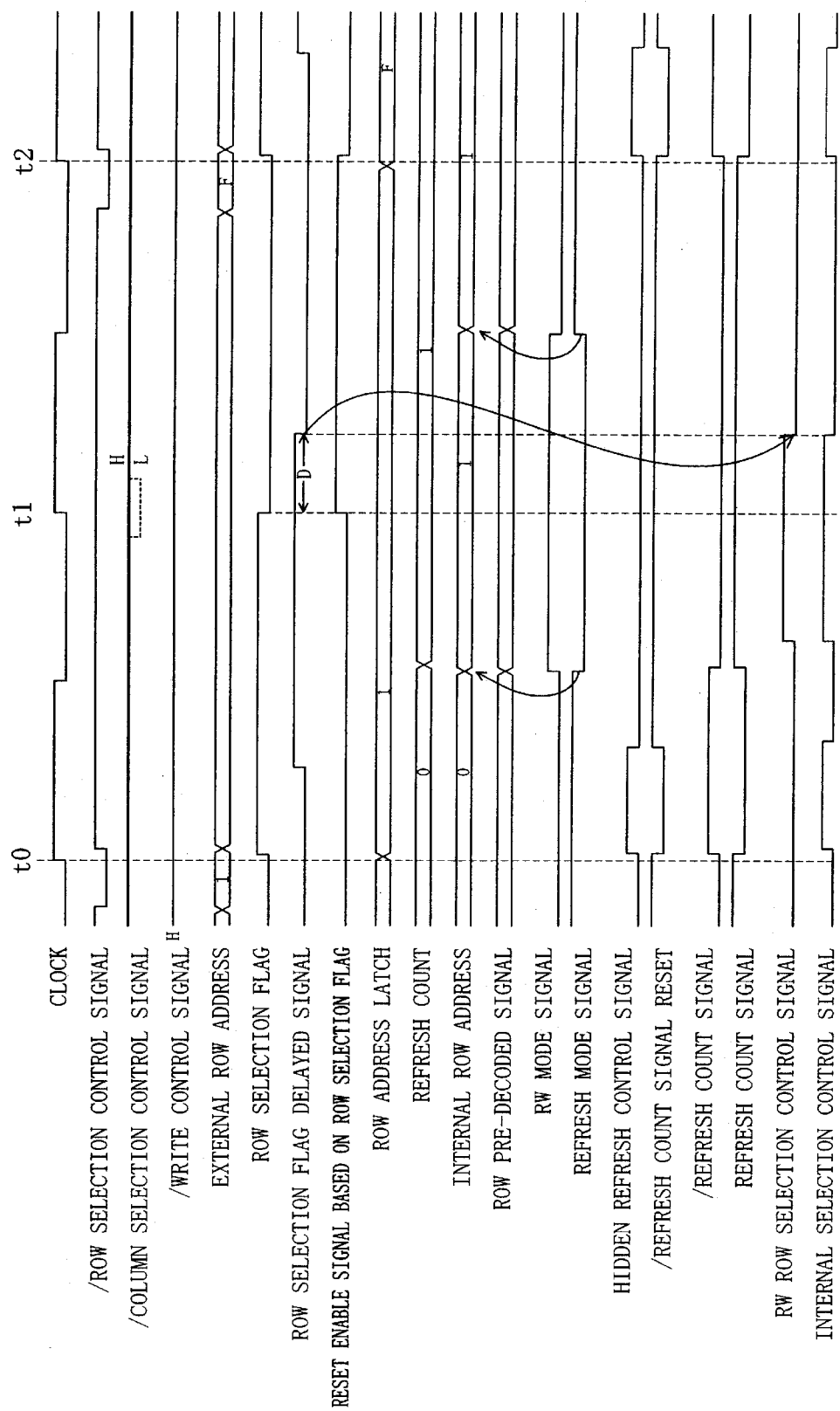
FIG. 11A shows the upper half of a timing chart for a dummy cycle of the semiconductor device of the present embodiment.
Figure 11B:
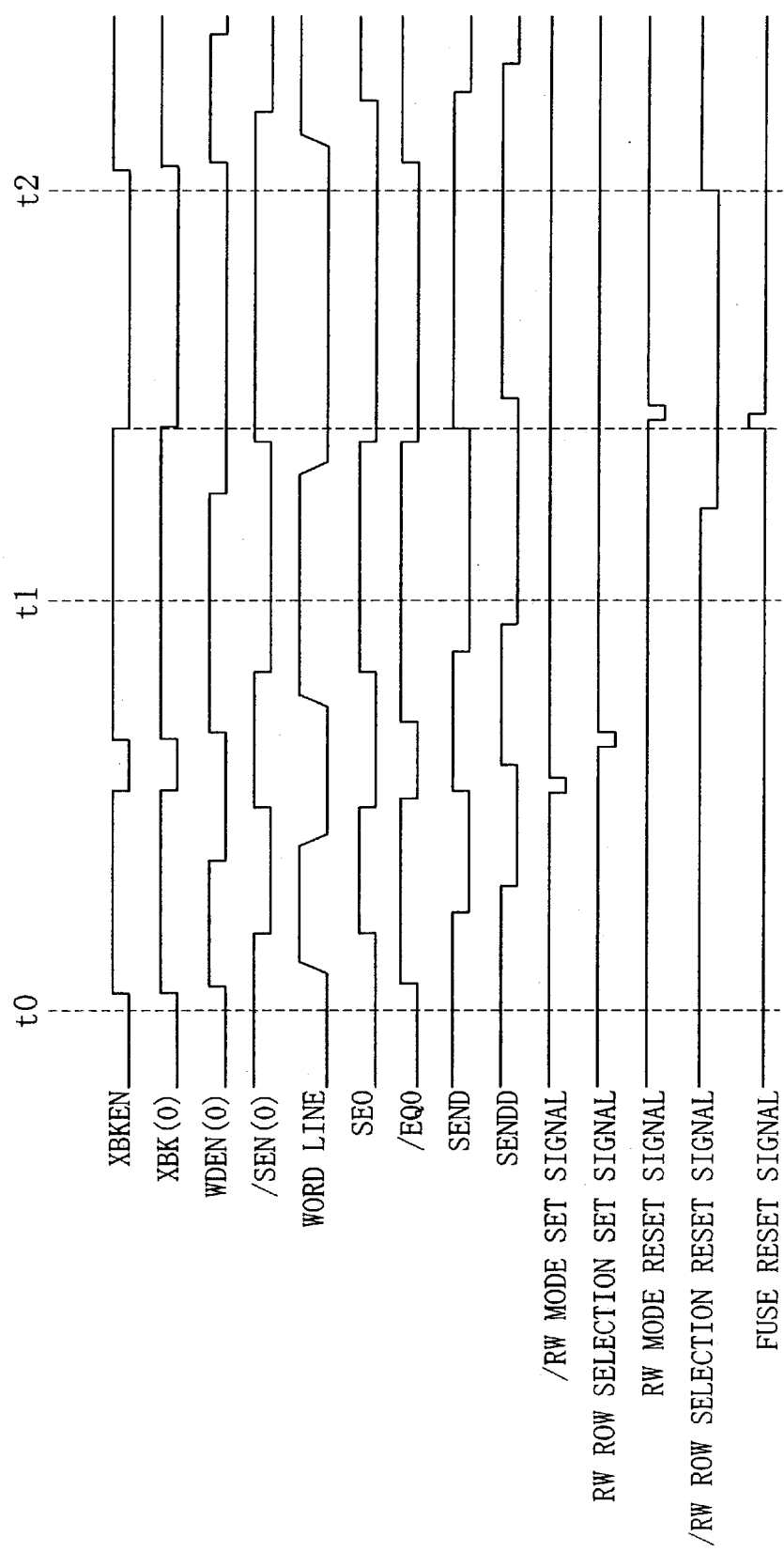
FIG. 11B shows the lower half of the timing chart for a dummy cycle of the semiconductor device of the present embodiment.

The row selection control circuit 450 is devised so as to ensure a long active period (H level period) of the RW row selection control signal (eventually serving as an internal row selection control signal) from the set/reset circuit 453 in a dummy cycle at a power on, etc. This will now be described. During a normal operation, the logic section 800 receives a /column selection control signal that is at the L level at time t1 of FIG. 10A. However, the /column selection control signal is kept at the H level in a dummy cycle as illustrated in FIG. 11A and FIG. 11B. The row selection control circuit 450 is provided with a set/reset circuit 485. The circuit 485 receives the /column selection control signal, and the row selection flag from an NQ terminal of the set/reset circuit 452. Receiving an H-level /column selection control signal and an H-level row selection flag, the circuit 465 outputs a reset signal (H level) of the RW row selection control signal. The reset signal is input to an AND circuit 486, and the AND circuit 486 also receives a delayed row selection flag, which is obtained by delaying the row selection flag by a predetermined time through a delay circuit 6-487 and a delay circuit 7-488. The output of the AND circuit 486 is input, as a reset signal, to a reset terminal NR of the set/reset circuit 453 which outputs the RW row selection control signal. The AND circuit 486 and the two delay circuits 6-487 and 7-488 together form a reset circuit 489. Therefore, even in a dummy cycle in which the /column selection control signal is kept at the H level, or in a case where an erroneous input is made in a normal operation whereby the /column selection control signal is brought to the H level, the resetting of the RW row selection control signal is delayed from the trailing edge of the row selection flag by a total amount of delay time of the two delay circuits, thereby keeping the internal row selection control signal at the H level for an increased period of time and thus sufficiently ensuring a data amplification operation by a sense amplifier.

Moreover, the row selection control circuit 450 receives an L-level /auto refresh control signal from the logic section 800. The signal is output during periods other than the data read/write operation, e.g., during a stand-by period. The /auto refresh control signal is input to a D terminal of the set/reset circuit (internal auto refresh control signal generation circuit) 451 via the OR circuit 410, thereby bringing the hidden refresh control signal to the H level at a leading edge of the clock, and activating the internal row selection control signal (internal auto refresh control signal) to the H level. A reset flag, which is the output of a D flip flop circuit 485a, is brought to the H level and the RW row selection control signal and the RW mode signal are reset, thereby preventing a read or write operation after a refresh operation.

Figure 6:
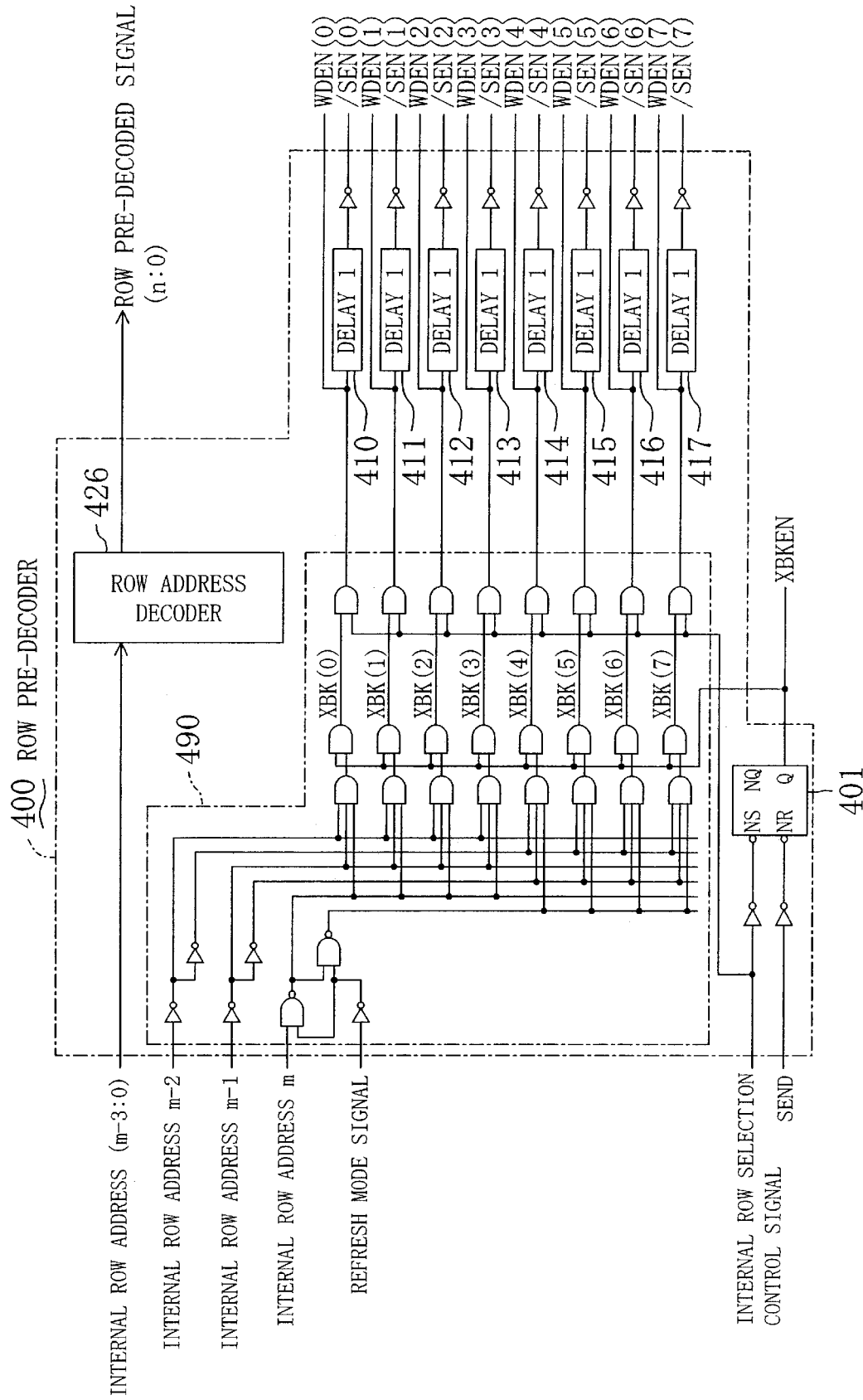
FIG. 6 is a diagram illustrating an internal configuration of a row pre-decoder provided in the semiconductor device.

Next, the internal configuration of the row pre-decoder 400 will be described with reference to FIG. 6. The row pre-decoder 400 receives an internal row address (m:0), a refresh mode signal and an internal row selection control signal from the row selection control circuit 450, as described above. The row pre-decoder 400 also receives the sense amplifier activation completion signal SEND from the AND circuit 750 illustrated in FIG. 1. Referring to FIG. 6, a set/reset circuit 401 is set and outputs an H-level block selection enable signal XBKEN when receiving an H-level internal row selection control signal, and the set/reset circuit 401 is reset and brings the block selection enable signal XBKEN to the L level when receiving the sense amplifier activation completion signal SEND.

A memory block selection circuit 490 of FIG. 6 is enabled by an H-level internal row selection control signal and an H-level block selection enable signal XBKEN. Then, the memory block selection circuit 490 selects one or two of the eight memory block pairs (B0_0, B0_1) to (B7_0, B7_1) of FIG. 1, based on the upper three bits of address (m:m−2) of the internal row address (m:0) and the refresh -mode signal. Block selection signals XBK(0) to XBK(7) are input, as word line enable signals WDEN(0) to WDEN(7), respectively to the row decoders D0_0 to D7_3 and the sense amplifier control sections SC0_0 to SC7_1 of FIG. 2, thereby enabling the row decoders, and controlling the sense amplifier groups and the precharge circuit groups in the sense amplifier control sections. Furthermore, the block selection signals XBK(0) to XBK(7) are delayed by a predetermined time by the delay circuits 410 to 417 and inverted into sense enable signals /SEN(0) to /SEN(7), respectively. The sense enable signals /SEN(0) to /SEN(7) are input to the corresponding sense amplifier control sections SC0_0 to SC7_1 of FIG. 2, thereby instructing the initiation of an amplification operation by the sense amplifier group. The sense enable signals /SEN(0) to /SEN(7) are input to an AND circuit 750 of FIG. 1. In addition, a row address decoder 426 receives and decodes bits (m−3:0) excluding the upper three bits of the internal row address (m:0). The decoded signal is input to the row decoders D0_0 to D7_3 of FIG. 2 as a row pre-decoded signal (n:0) and used for word line selection.

Figure 7:
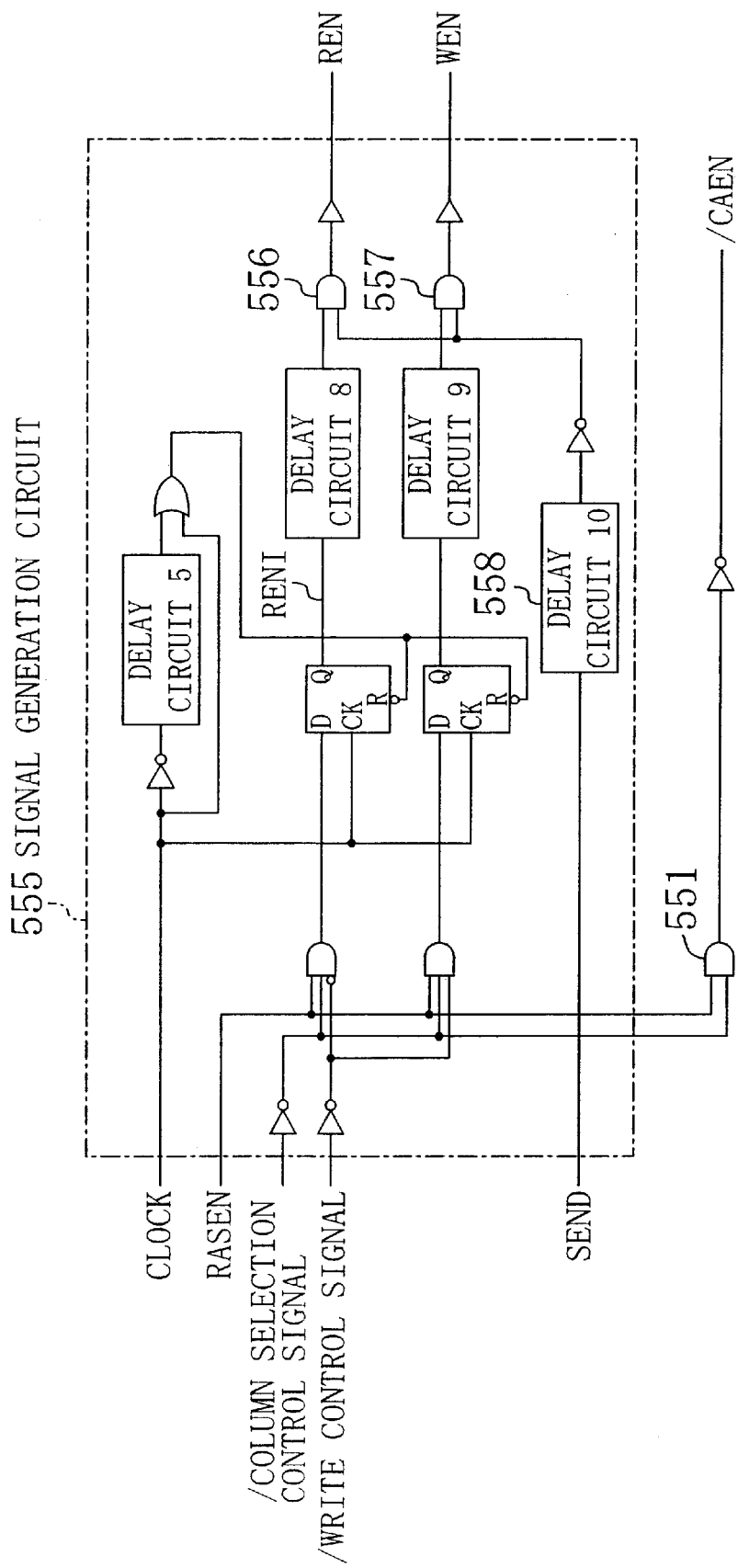
FIG. 7 is a diagram illustrating an internal configuration of a control circuit provided in the semiconductor device.

Next, the internal configuration of the control circuit 550 of FIG. 3 will be described with reference to FIG. 7. The control circuit 550 of FIG. 7 is a circuit for enabling the operation of the column selection control circuit 600 in a data read/write operation following a refresh operation after data of each bit line is amplified by the sense amplifier group. The control circuit 550 of FIG. 7 includes an AND circuit 551 that receives a RAS enable signal RASEN from the row selection control circuit 450 and a /column selection control signal from the logic section 800. The output of the AND circuit 551 is input to the column selection control circuit 600 as a column address fetch enable signal /CAEN. A signal generation circuit 555 receives the RAS enable signal RASEN, the /column selection control signal from the logic section 800 and a /write control signal, and outputs signals REN and WEN instructing the initiation of a read operation and a write operation, respectively. The signals REN and WEN are input to the column selection control circuit 600. The sense amplifier activation completion signal SEND is input from the AND circuit 750 of FIG. 1 to the signal generation circuit 555, and a signal obtained by delaying the signal SEND by a predetermined time by a delay circuit 10-558 is input to AND circuits 556 and 557 so that the read/write initiation signals REN and WEN cannot be output before receiving the delayed signal.

Next, the internal configuration of the column selection control circuit 600 of FIG. 3 will be described with reference to FIG. 8. In the column selection control circuit 600 of FIG. 8, four column address latches 601 to 604 latch the column addresses (3:0) from the logic section 800, and then the addresses are decoded by a column address decoder 607 into a column address signal /MBT (7:0). The column address signal /MBT is input to the sense amplifier control sections SC0_0 to SC7_1 of FIG. 2 so as to be used for controlling the switch circuits T0_0 to T7_1 for selectively connecting selected ones of the plurality of bit lines BL and /BL to the main bit lines MB1 to MB4k. Moreover, a signal generation circuit 610 generates signals (YG0, /YG0) to (YG3, /YG3) for controlling the switch circuit 110 for selectively connecting the main bit lines MB1 to MB4k to the main amplifiers MA1 to MAk based on the column address (3:0). The signal is used for controlling the connection between the main bit lines MB1 to MBk and the main amplifiers MA1 to MAk.

Figure 8:
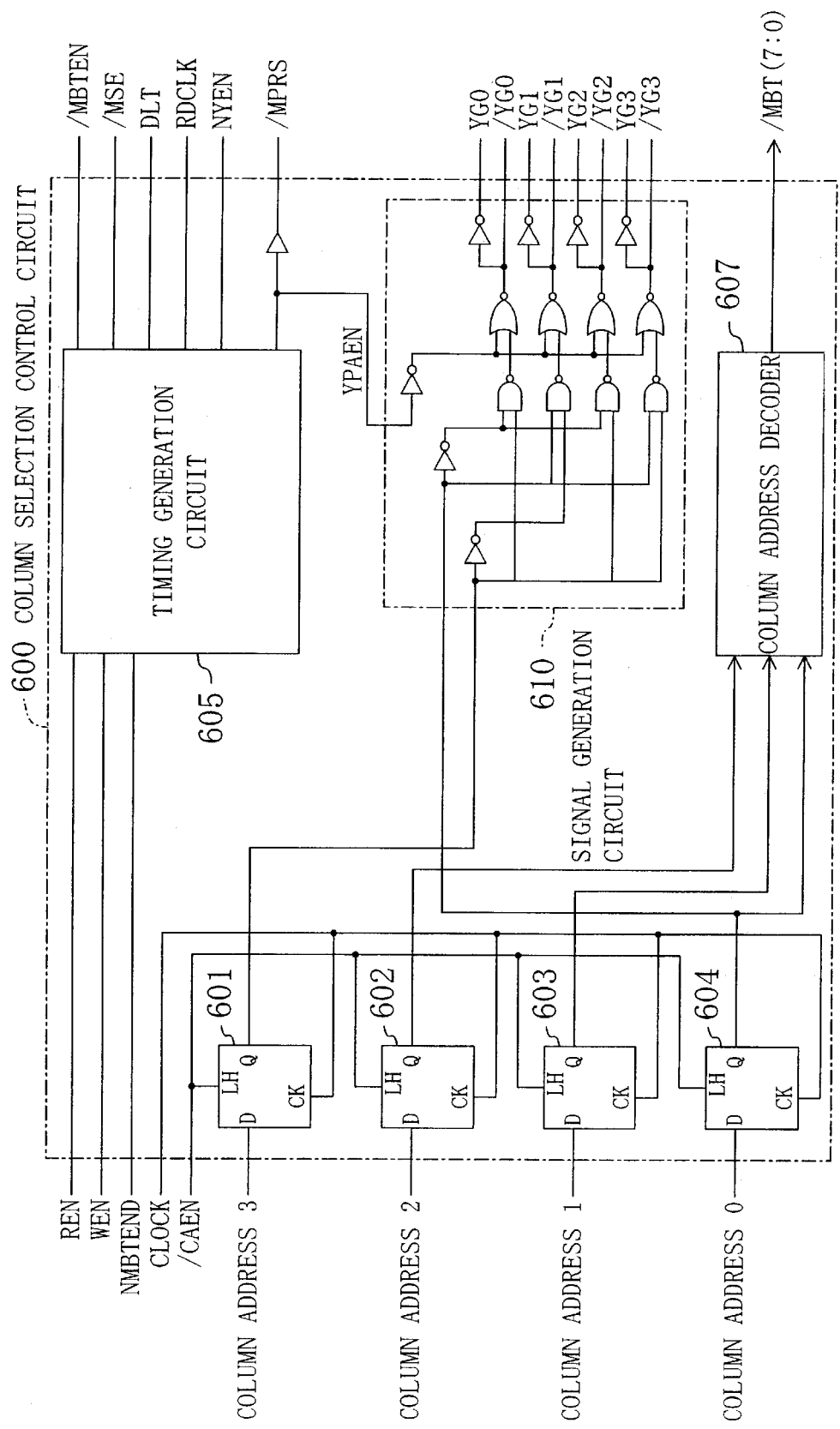
FIG. 8 is a diagram illustrating an internal configuration of a column selection control circuit provided in the semiconductor device.

Furthermore, a timing generation circuit 605 of FIG. 8 generates a signal /MBTEN for controlling switch circuits (the switch circuits T0_0, T0_1, . . . , in the sense amplifier block A0_0) for connecting bit lines to main bit lines, a main sense amplifier enable signal /MSE for operating the main amplifiers MA1 to MAk, a signal DLT for controlling latch circuits LT1 to LTk, a clock RDCLK supplied to the latch circuits LT1 to LT4k, a signal NYEN for resetting the RW row selection control signal of the set/reset circuit 453 of the row selection control circuit 450, a signal /MPRS for controlling the main bit line precharge circuit 100, and a signal YPAEN for enabling the operation of the signal generation circuit 610. These signals are generated with the respective waveforms illustrated in FIG. 10A and FIG. 10B. Thus, data amplified by the sense amplifier group is successively read out via the main bit lines MB1 to MB4k, the main amplifiers MA1 to MAk, the latch circuits LT1 to LTk and the flip flop circuits FF1 to FFk.

Figure 9:
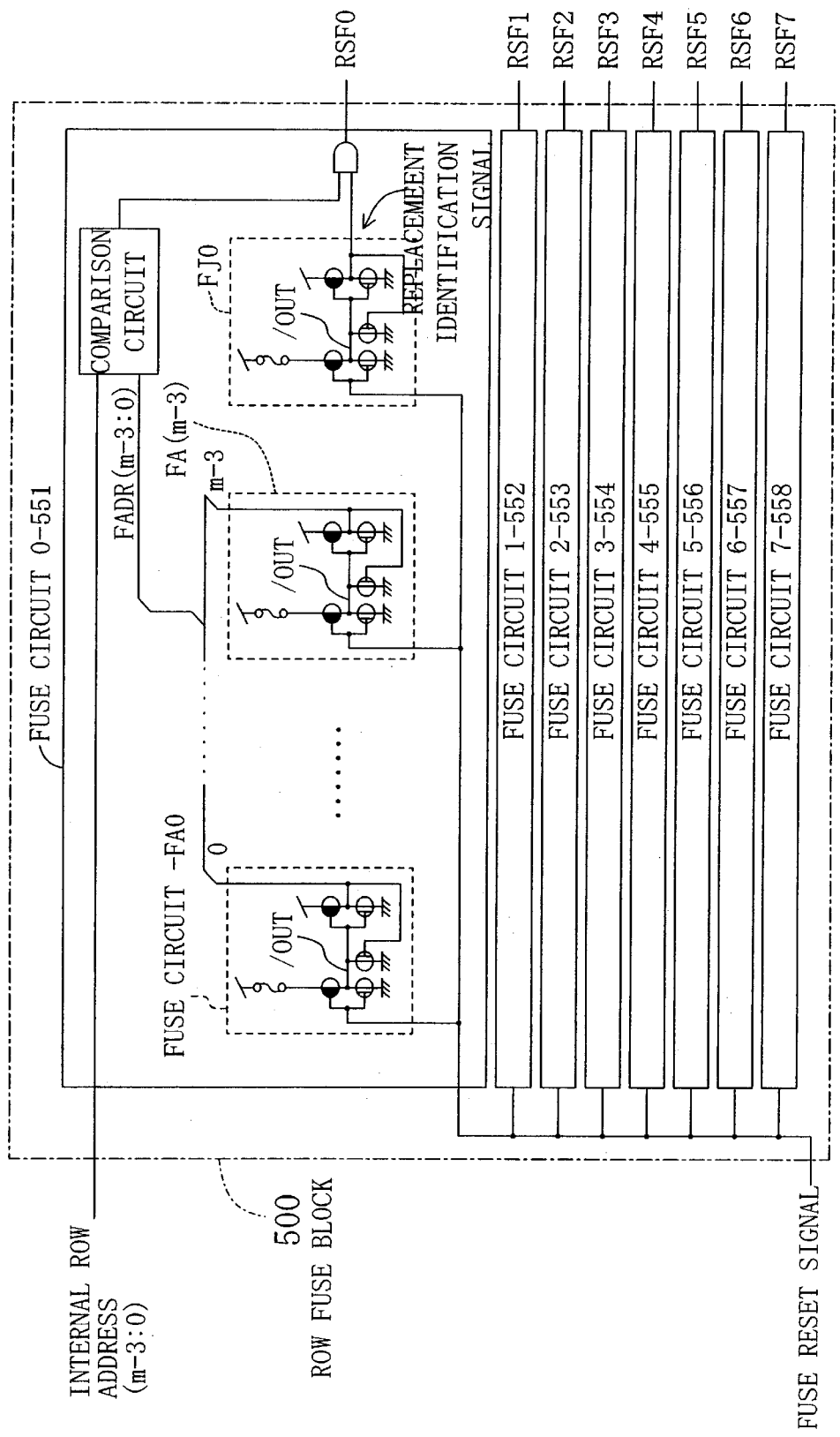
FIG. 9 is a diagram illustrating an internal configuration of a row fuse block provided in the semiconductor device.

Next, the internal configuration of the row fuse block 500 will be described with reference to FIG. 9. The row fuse block 500 of FIG. 9 includes eight fuse circuits 0-551 to 7-558 having the same configuration. These fuse circuits 0-551 to 7-558 respectively correspond to the memory blocks B0_0 to B7_0. Inoperable row addresses are previously programmed in the fuses. When selecting a word line, the internal row address and the address programmed in the fuse are compared with each other so that if it is an inoperable address, a spare word line is selected. The fuse circuit will be described in detail with respect to the fuse circuit 0-551 as an example. In the fuse circuit 0-551, the output FADR (m−3:0) of the fuse circuits FA0 to FA(m−3) denotes a replacement row address. The replacement identification signal of a fuse circuit FJ0 indicates whether a word line is to be replaced by a spare word line for the memory block B0_0. The replacement identification signal being at the H level indicates that the word line specified by the replacement row address FADR (m−3:0) is to be replaced. The fuse circuits FA0 to FA(m−3) and FJ0 are reset when the fuse reset signal transitions to the H level. When a fuse is blown, the voltage level of an /OUT signal in each fuse circuit becomes unstable. Therefore, in the present embodiment, when a fuse is blown, the voltage level of the /OUT signal is initialized by a fuse reset signal of a reset signal generation circuit 495 illustrated in FIG. 5 for every data read or write operation or auto refresh operation.

Figure 5:
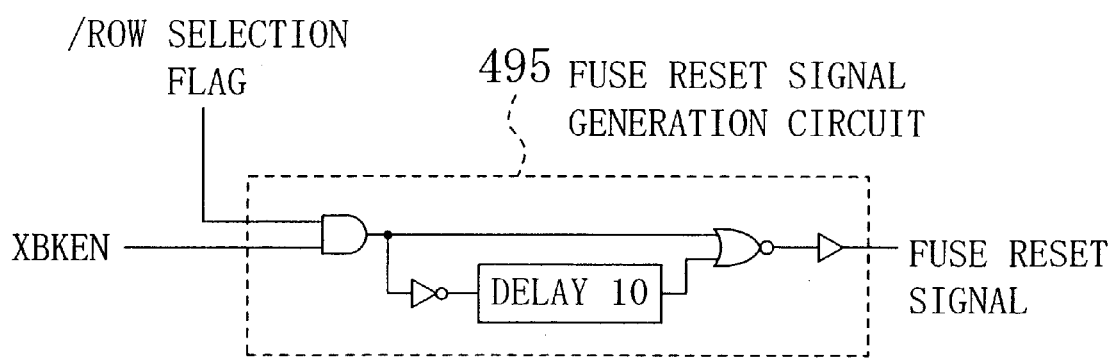
FIG. 5 is a diagram illustrating an internal configuration of a fuse reset signal generation circuit provided in the semiconductor device.

Moreover, the row selection control circuit 450 includes the reset signal generation circuit (fuse reset circuit) 495 as illustrated in FIG. 5. The signal generation circuit 495 generates a fuse reset signal to be output to the row fuse block 500 illustrated in FIG. 3. The reset signal generation circuit 495 receives the row selection flag from the set/reset circuit 452 illustrated in FIG. 4, and the block selection enable signal XBKEN from the row pre-decoder 400 illustrated in FIG. 6. When the block selection enable signal XBKEN transitions to the L level when the row selection flag is being at the L level, i.e., in a read or write operation or in an auto refresh operation based on the /auto refresh control signal from the logic section 800, the word line is turned OFF and the amplification of data by the bit line is completed, after which the reset signal generation circuit 495 generates the fuse reset signal, which is an H-level short pulse.

The operation of the semiconductor device of the present embodiment will now be described with reference to the timing charts of FIG. 10A and FIG. 10B. A data read operation will be described as an example, while the description of a data write operation will be omitted. The data read operation can be generally divided into two operations, i.e., a refresh operation before reading data and a data read operation, and the latter can be further divided into a row control operation and a column control operation. These operations will now be described sequentially.

Refresh Operation

Figure 10B:
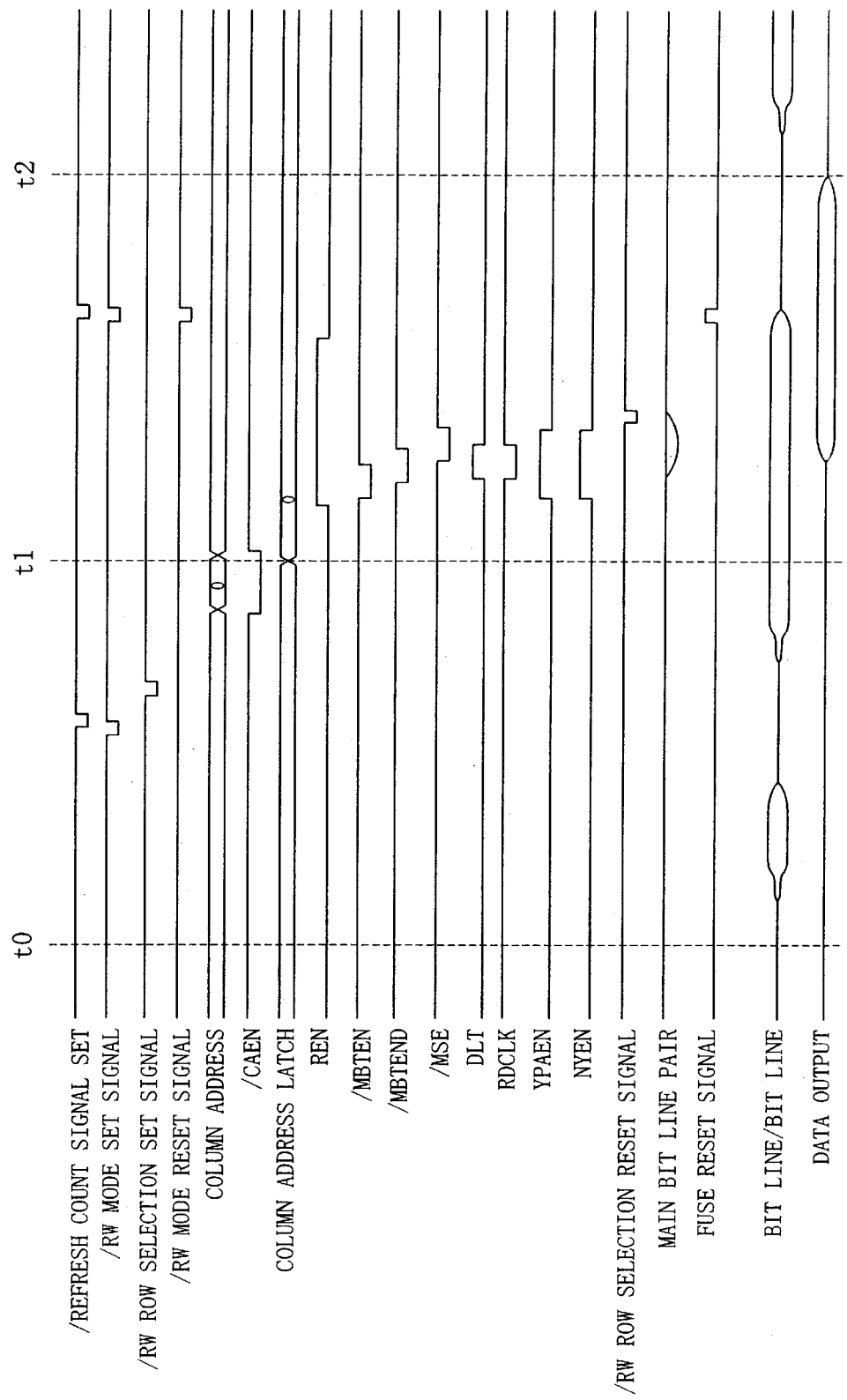
FIG. 10B shows the lower half of the timing chart for a read operation of the semiconductor device of the present embodiment.

Referring to FIG. 10A and FIG. 10B, the logic section 800 outputs an L-level /row selection control signal to the row selection control circuit 450 at time t0. In the row selection control circuit 450, the set/reset circuit 451 outputs, from its Q terminal, an H-level hidden refresh control signal, and the internal row selection control signal transitions to the H level. Furthermore, since the Q output of the set/reset circuit 454, i.e., an RW mode flag, is at the L level, which is the initial state thereof, the refresh mode signal is at the H level and the address selection circuit 475 selects the refresh counter 476 side, whereby the refresh address (m:0) of the refresh counter 476 (e.g., "0" in hexadecimal representation) is output to the row pre-decoder 400 as an internal row address (m:0). At this time, the set/reset circuit 455 is set by the hidden refresh control signal and outputs an H-level /refresh count signal, and the refresh count signal to the refresh counter 476 is set to the L level. On the other hand, the row address latch 477 latches an external row address (m:0) (e.g., 1) from the logic section 800.

The row pre-decoder 400 receives the H-level internal row selection control signal, the internal row address (refresh address) and the H-level refresh mode signal, and a memory block selection circuit 490 sets only the signals XBK(0) and XBK(4) to the H level, thereby selecting the memory cell arrays C0_0 to C0_3 and C4_0 to C4_3 of the two pairs of memory blocks (B0_0 and B0_1) and (B4_0 and B4_1). The operation of selecting the memory cell arrays C0_0 and C0_1 will now be described as an example. Since the row pre-decoder 400 outputs an H-level WDEN(0), a signal /EQ0 transitions to the H level and the sense amplifier control section SC0_0 turns OFF the pre-charge circuit group C0, thereby releasing the precharge of the bit line pairs 1 to 4k. Moreover, the row decoders D0_0 and D0_1 receive the row pre-decoded signal (n:0) from the row address decoder 426 and enables only the word line 0, thereby outputting the data of the memory cells MC connected to the word line 0 to the bit line pairs 1 to 4k. Then, in the row pre-decoder 400, the signal /SEN(0) transitions to the L level when outputting of data to the bit line pairs is completed (after waiting for the delay time of the delay circuit 1-410), and the sense amplifier control section SC0_0 enables the 8k sense amplifiers of the sense amplifier groups S0_0 and S0_1 of the sense amplifier block A0_0 so as to initiate the amplification of the data that has been read out onto the bit line pairs. Thus, a refresh operation is performed.

Then, as the signal /SEN(0) transitions to the L level, the AND circuit 750 outputs an-L-level sense amplifier activation completion signal SEND. In the row selection control circuit 450, having received the signal SEND, after the data on the bit line pairs has been sufficiently amplified by the sense amplifier operation (i.e., after passage of the total delay time of the delay circuit 2-456 and the delay circuit 3-457), the set/reset circuit 451 is reset based on the sense amplifier activation completion signal SEND, whereby the hidden refresh control signal transitions to the L level and internal row selection control signal also transitions to the L level. Accordingly, in the row address decoder 400, the signal WDEN(0) returns to the L level and the signal /SEN(0) returns to the H level, thereby terminating the selection of the word line 0 by the row decoders D0_0 and D0_1 and the sense amplifier operation of the sense amplifier groups S0_0 and S0_1 while initiating the precharge operation of the bit line by the precharge circuits C0. Moreover, as the signal /SEN(0) returns to the H level, the sense amplifier activation completion signal SEND from the AND circuit 750 also returns to the H level.

Row Control of Data Read Operation

The row control is a control operation of reading out data onto the bit line pairs and amplifying the data. As the sense amplifier activation completion signal SEND returns to the H level, in the row selection control circuit 450, the set/reset circuit 453 is set based on the sense amplifier activation completion signal SEND, and an H-level RW mode signal is output. As a result, the refresh mode signal transitions to the L level and the address selection circuit 475 receives the H-level RW mode signal to select the row address latch 477 side, whereby the external row address (m:0)=1 is output to the row pre-decoder 400 as an internal row address (m:0). In parallel to this operation, the set/reset circuit 455 is reset upon receiving the H-level sense amplifier activation completion signal SEND via the pulse generator 460, the /refresh count signal transitions to the L level, and the refresh count signal transitions to the H level, thereby incrementing the refresh counter 476, e.g., from refresh address 0 to refresh address 1.

Furthermore, the H-level sense amplifier activation completion signal SEND is input to the set/reset circuit 453 after being delayed by the three delay circuits 2-456, 3-457 and 4-458 (i.e., after the completion of the bit line precharge operation), thereby setting the circuit 453, which then outputs an H-level RW row selection control signal from its Q terminal. Thus, the internal row selection control signal, being output to the row pre-decoder 400, transitions to the H level. In the row pre-decoder 400, the memory block selection circuit 490 sets only the block selection signal XBK(0) to the H level because the refresh mode signal is at the L level. Since the external row address (m:0)=1, the row decoders D0_0 and D0_1 select the word line 1 of the memory cell arrays C0_0 to C0_3 of the memory blocks B0_0 and B0_1. Thereafter, data that have been read out onto the bit line pairs 1 to 4k are amplified by the sense amplifier groups S0_0 to S0_3 in the four memory cell arrays C0_0 to C0_3 through an operation as the refresh operation described above. Due to the set/reset circuit 453 outputting the H-level RW row selection control signal, an H-level RAS enable signal RASEN is output from the buffer 462.

Column Control of Data Read Operation

The column control is a control operation of reading out amplified data from the main bit line pairs MB1 to MB4k via the flip flop circuits FF1 to FFk. An L-level /column selection control signal is output from the logic section 800 before the leading edge of the clock at time t1 in FIG. 10A. In the control circuit 550, the L-level /column selection control signal and the H level RAS enable signal RASEN from the buffer 462 are received, thereby transitioning the column address fetch enable signal /CAEN to the L level, after which an H-level read initiation signal REN is output from the signal generation circuit 555. As a result, in the column selection control circuit 600, a column address (3:0) (e.g., 0) from the logic section 800 is latched in the column address latches 601 to 604 at the leading edge of the clock at time t1 of FIG. 10A, and only the switch circuit T0_0 in the memory block B0_0 is controlled by the column address signal /MBT (7:0) from the column address decoder 607 so that, for example, every other one of the 4k sense amplifiers of the sense amplifier group S0_0 in the memory block B0_0 is connected to a corresponding one of the main bit lines MB1 to MB4k+1. At the same time, only the signal YG(0) from the signal generation circuit 610 transitions to the H level and only the signal /YG(0) therefrom transitions to the L level so that the data that have been output to the main bit lines MB1 to MB4k+1 are transmitted to the main amplifiers MA1 to MAk.

Furthermore, the termination of the precharge operation of the main bit lines MB1 to MB4k+1, the amplification operation at the main amplifiers MA1 to MAk, the data latch operation at the latch circuits LT1 to LTk, and the data latch operation at the flip flop circuits FF1 to FFk, are controlled by the signals /MBTEN, /MSE, DLT, RDCLK and /MPRS, which are generated from the timing generation circuit 605, whereby the data that have been output onto the main bit lines MB1 to MB4k+1 are read out via the flip flop circuits FF1 to FFk. After the data read operation, the bit line pairs (BL1, /BL1) to (BL4k, /BL4k) and the main bit line pairs MB1 to MB4k+1 are disconnected from each other, and the operation of precharging the main bit lines MB1 to MB4k+1 is performed.

Then, an L-level signal NYEN is output from the timing generation circuit 605 of the column selection control circuit 600. Thus, in the row selection control circuit 450, the set/reset circuit 453 is reset, thereby transitioning the RW row selection control signal to the L level and also the internal row selection control signal to the L level. As a result, in the row pre-decoder 400, the signals WDEN(0) and /SEN(0) transition to the L level, thereby deselecting the word line 1 of the four memory cell arrays C00 to C0_3 of the memory block B0_0, terminating the sense amplifier operation at the sense amplifier groups S0_0 to S0_3, and initiating the precharge operation of the bit line pairs. Furthermore, when the sense amplifier activation completion signal SEND returns to the H level, the set/reset circuit 454 in the row selection control circuit 450 is reset, thereby transitioning the RW mode signal to the L level. Thus, the refresh mode signal returns to the H level, and the address selection circuit 475 selects the refresh counter 476 side, whereby the internal row address (m−1:0) is set to the refresh address (m−1:0) (=1) of the refresh counter 476, and thus the internal row address m=H.

FIG. 11A and FIG. 11B are timing charts for a dummy cycle at a power on, or the like. In the normal read cycle illustrated in FIG. 10A and FIG. 10B, the /row selection control signal is at the L level at time t0 and the /column selection control signal is at the L level at time t1. In the dummy cycle, the /column selection control signal is kept at the H level at time t1. Moreover, at the leading edge of the clock at time t1, the row selection flag, which is an output from the set/reset circuit 452 of the row selection control circuit 450, is at the H level. Therefore, the set/reset circuit 485 of the row selection control circuit 450 immediately outputs an H level reset enable signal based on the row selection flag as illustrated in FIG. 11A. However, the AND circuit 486 does not allow the reset enable signal to pass therethrough until it receives the row selection flag delayed signal, obtained by delaying the row selection flag by a predetermined time by the delay circuits 6-487 and 7-488 (until the predetermined period D passes). Therefore, resetting of the RW row selection control signal from the set/reset circuit 453 is delayed by the predetermined period D, and the RW row selection control signal is kept at the H level for a period of time that is extended by the period D, thereby ensuring a sufficient pulse width for the internal row selection control signal to be kept at the H level. As a result, even in a dummy cycle, the data is sufficiently amplified by a sense amplifier.

Figure 12A:
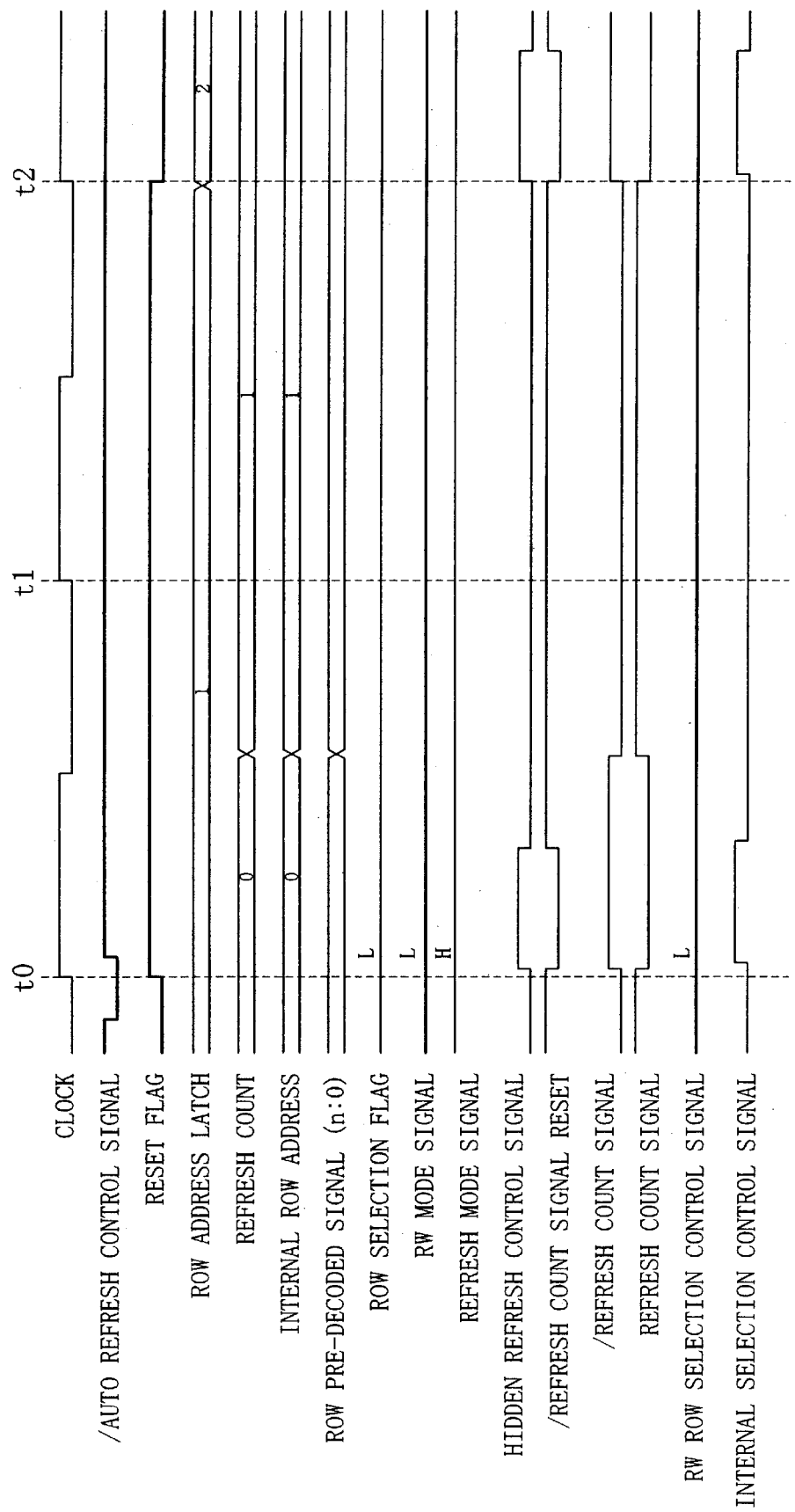
FIG. 12A shows the upper half of a timing chart for an auto refresh operation of the semiconductor device of the present embodiment.
Figure 12B:
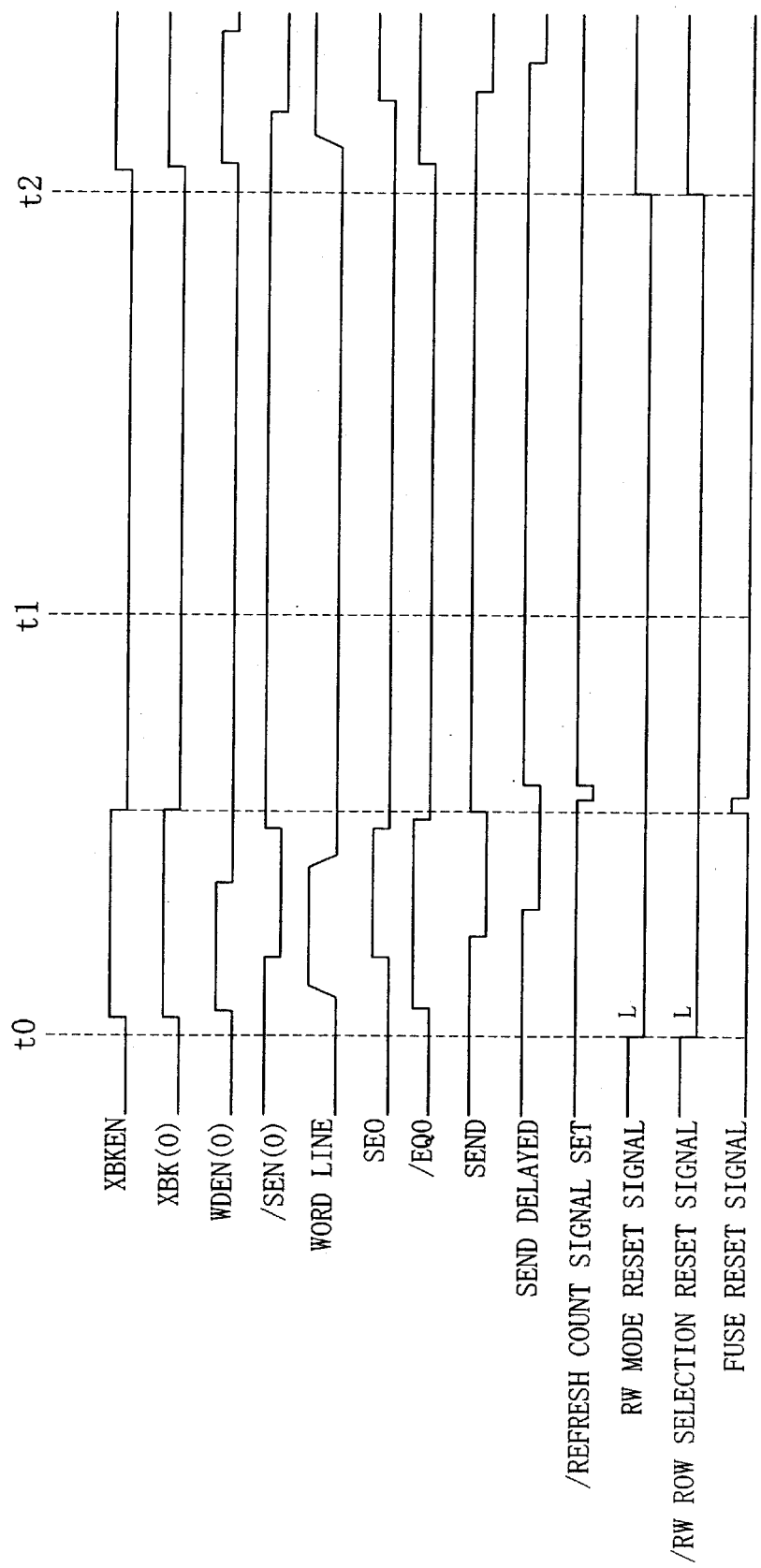
FIG. 12B shows the lower half of the timing chart for an auto refresh operation of the semiconductor device of the present embodiment.

FIG. 12A and FIG. 12B are timing charts for an auto refresh operation. As can be seen from the figures, during an operation other than a data read/write operation, e.g., a stand-by operation, an L-level /auto refresh control signal is output from the logic section 800, and a hidden refresh control signal is output from the set/reset circuit 451, whereby the internal row selection control signal transitions to the H level. As a result, the bit line pair of a predetermined row is refreshed as described above. The reset flag, which is an output from the D flip flop circuit 485*a*, transitions to the H level at time t0, and the RW mode signal and the RW row selection control signal respectively from the set/reset circuits 454 and 453 of the row selection control circuit 450 are fixed at the L level, whereby a data read or write operation is not initiated following the refresh operation.

Figure 13A:
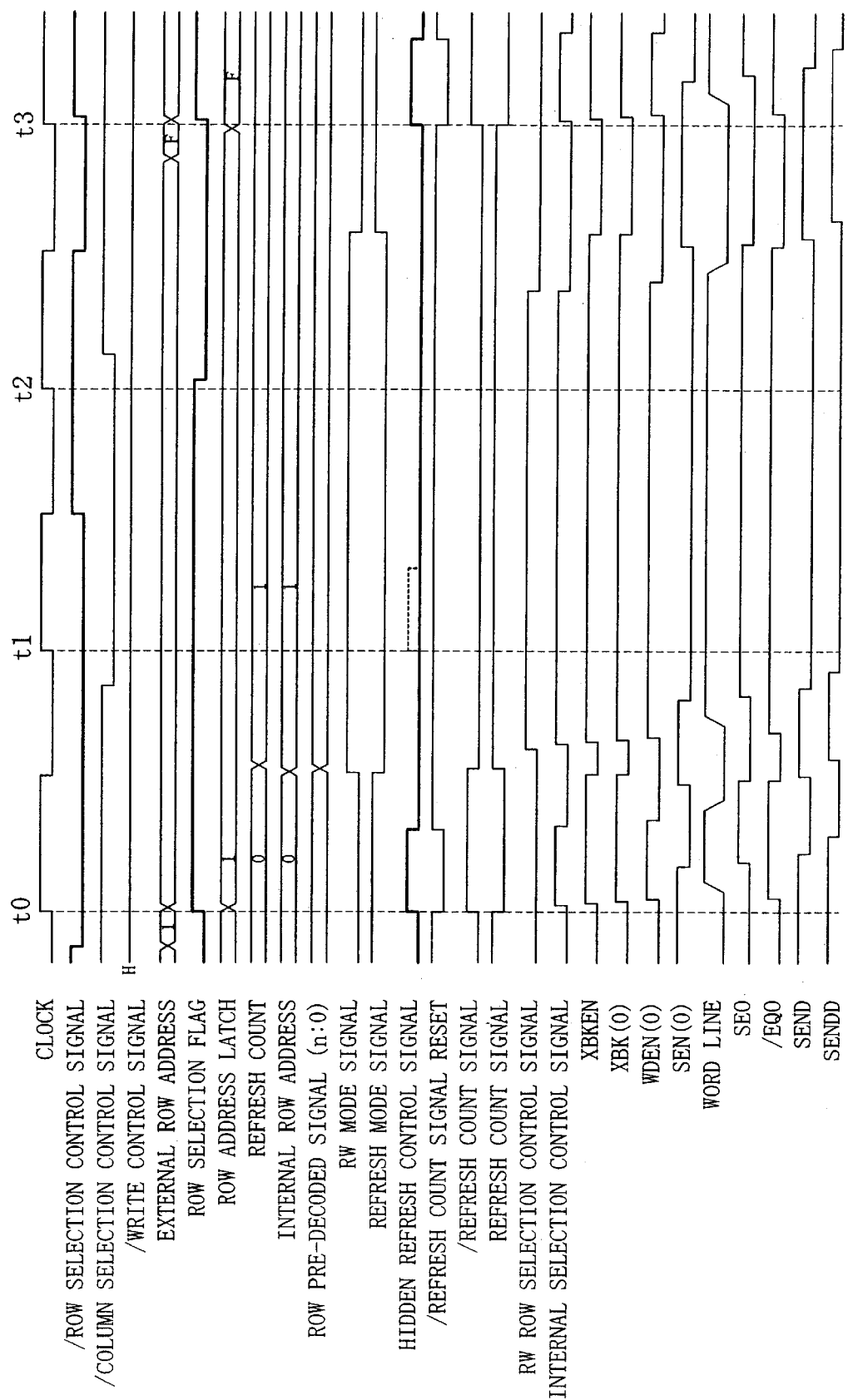
FIG. 13A shows the upper half of a timing chart for a page mode of the semiconductor device of the present embodiment.
Figure 13B:
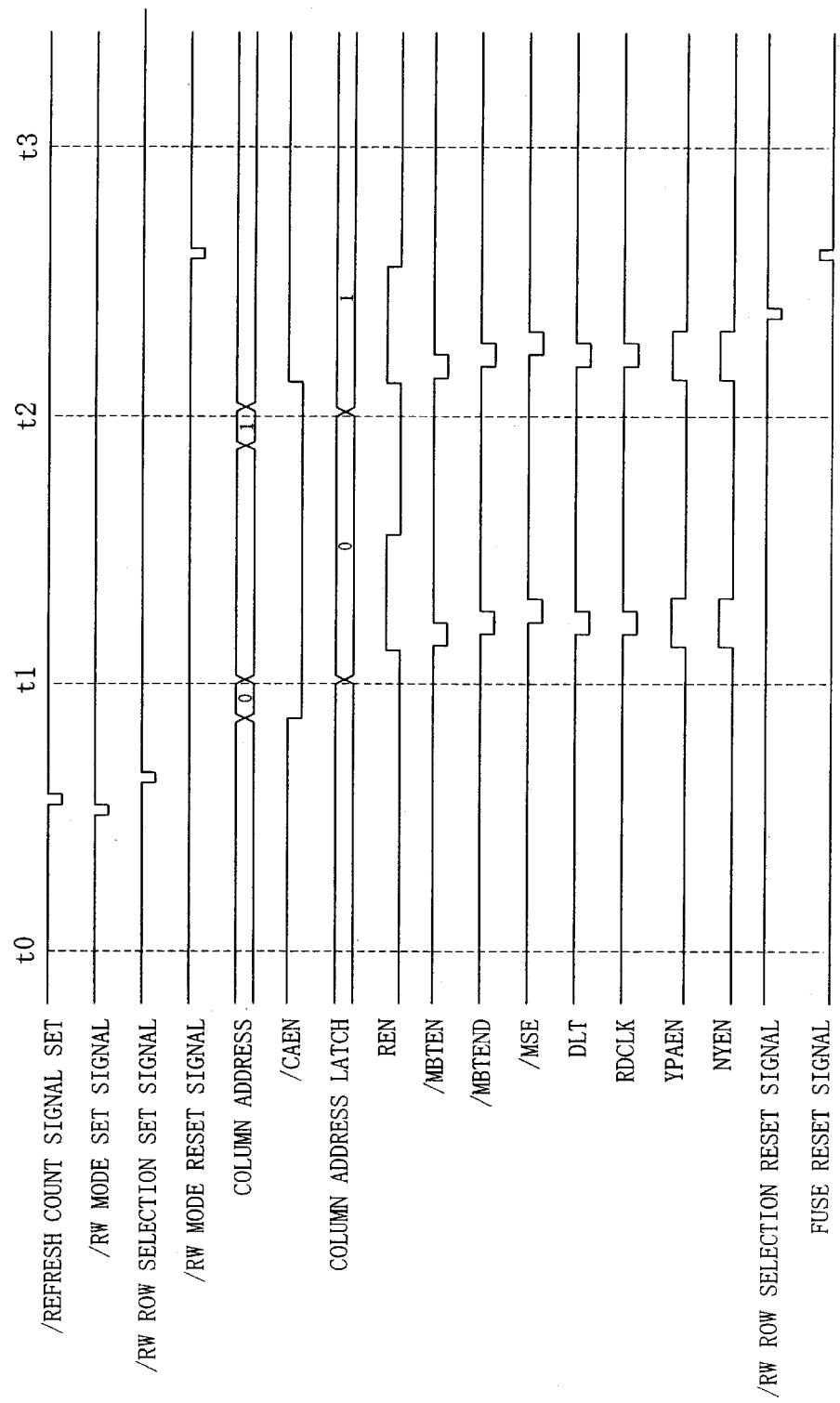
FIG. 13B shows the lower half of the timing chart for a page mode of the semiconductor device of the present embodiment.
Figure 14:
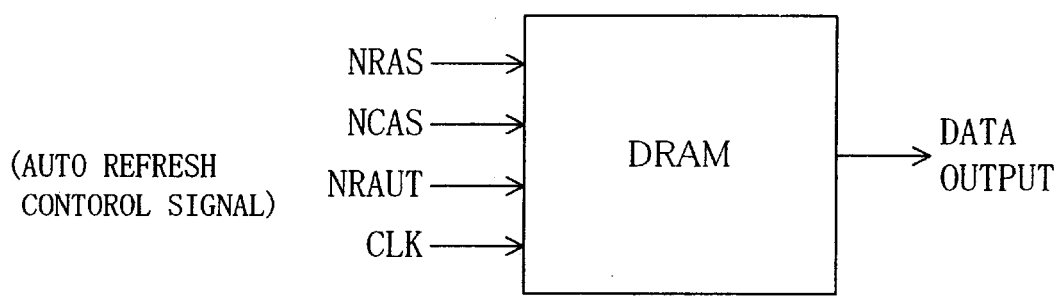
FIG. 14 is a schematic diagram illustrating a conventional DRAM.
Figure 15:
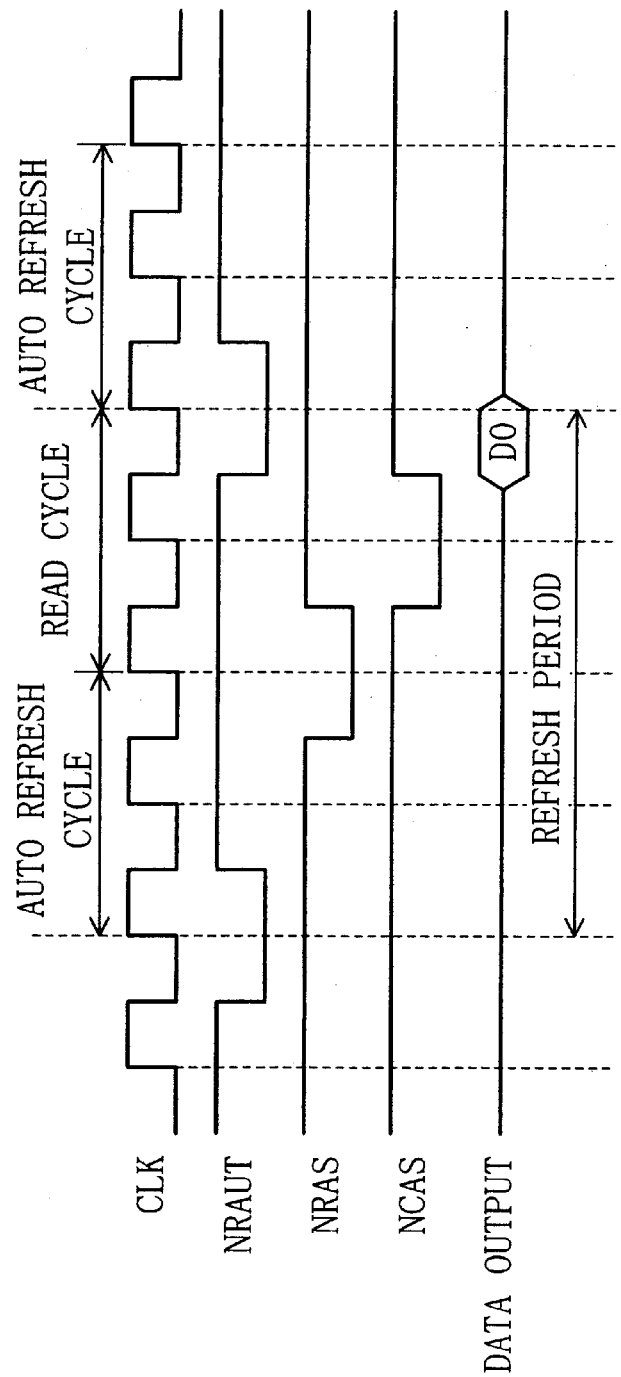
FIG. 15 is a timing chart illustrating an auto refresh operation and a read operation of the conventional DRAM.

FIG. 13A and FIG. 13B are timing charts illustrating an operation in a page mode. In the page mode, the /row selection control signal from the logic section 800 is kept at the L level at a plurality of leading edges of the clock (at time t0 and time t1 in the illustrated example). During the period from time t0 to time t1, the refresh operation is performed and the data to be read out is amplified by a bit line pair as described above. However, at time t1 at which the clock rises, the set/reset circuit 451 of the row selection control circuit 450 is receiving, at its LH terminal, an H-level row selection flag from the set/reset circuit 452, thereby prohibiting an H-level hidden refresh control signal from being re-output. Therefore, in the page mode, the refresh operation from time t1 is not performed, and the amplified data on the bit line pair is immediately read out from the flip flop circuits FF1 to FFk via the main bit lines MB1 to MB4*k*+1.

What is claimed is:

1. A semiconductor device, comprising;
a plurality of memory cells, arranged in rows and columns, that need to be refreshed;
a plurality of bit lines each coupled to a column of said plurality of memory cells;
a plurality of sense amplifiers respectively coupled to said plurality of bit lines, the plurality of sense amplifiers being coupled to a data path for reading out data amplified by the plurality of sense amplifiers;
a row selection control circuit for generating both a refresh control signal and a read or write row selection control signal within a single read or write operation cycle responsive to receiving a data read or write control signal;
a row selection circuit for selecting a row of the plurality of memory cells in response to the refresh control signal and for selecting a row of the plurality of memory cells in response to the read or write row selection control signal; and
a sense amplifier control circuit for activating the plurality of sense amplifiers in response to the refresh control signal and for activating the plurality of sense amplifiers in response to the read or write row selection control signal.

2. The semiconductor device of claim 1, wherein the plurality of sense amplifiers are activated for a refresh operation and further activated for a read or write operation within the single read or write operation cycle responsive to the data read or write control signal.

3. The semiconductor device of claim 1, wherein the row selection circuit receives a clock signal and wherein the single read or write operation cycle includes two clock cycles of the clock signal.

4. The semiconductor device of claim 1, wherein the row selection control circuit includes an OR circuit coupled to receive the refresh control signal and the read or write row selection control signal for outputting an internal row selection control signal and wherein the internal row selection control signal is supplied to the row selection circuit and the sense amplifier control circuit.

5. The semiconductor device of claim 1, wherein the row selection control circuit comprises:
a refresh counter,
an address latch for latching a row address of data to be read or written;
an address selection circuit selectively coupled to the refresh counter and the address latch for outputting an internal row address.

6. The semiconductor device of claim 1, wherein the row selection control circuit further receives an auto refresh control signal and generates an internal auto refresh control signal responsive to the auto refresh control signal, wherein the row selection circuit selects a row of the plurality of memory cells in response to the internal auto refresh control signal, and wherein the sense amplifier control circuit activates the plurality of sense amplifiers in response to the internal auto refresh control signal.

7. The semiconductor device of claim 6, wherein both the refresh control signal and the internal auto refresh control signal are outputted on a common signal line.

8. The semiconductor device of claim 1, further comprising a column selection control circuit for generating a column switch control signal to control access to a selected bit line in response to a column selection control signal.

9. The semiconductor device of claim 8, wherein the column selection control circuit further generates a reset signal in response to the column selection control signal and wherein the row selection control circuit resets the read or write row selection control signal in response to the reset signal.

10. The semiconductor device of claim 8, wherein the row selection control circuit receives a clock signal and resets the read or write row selection control signal after a predetermined delay time from a predetermined clock edge of the clock signal when the column selection control signal is not received at the predetermined clock edge.

* * * * *